United States Patent [19]

Shah et al.

[11] Patent Number: 4,601,019
[45] Date of Patent: Jul. 15, 1986

[54] MEMORY WITH REDUNDANCY

[75] Inventors: Ashwin H. Shah; James D. Gallia, both of Dallas; I-Fay Wang, Richardson; Shivaling S. Mahant-Shetti, Dallas, all of Tex.

[73] Assignee: Texas Instruments Incorporated, Dallas, Tex.

[21] Appl. No.: 528,209

[22] Filed: Aug. 31, 1983

[51] Int. Cl.⁴ .............................................. G11C 13/00
[52] U.S. Cl. .................................... 365/200; 365/210; 365/230; 364/900; 371/21
[58] Field of Search ........................ 365/200, 210, 230; 371/21

[56] References Cited

U.S. PATENT DOCUMENTS 3,810,301  5/1974  Cook .................................. 365/200
3,900,837  8/1975  Hunter ............................... 365/200
3,986,179  10/1976  Elmer et al. ..................... 365/200

*Primary Examiner*—Terrell W. Fears
*Attorney, Agent, or Firm*—Robert Groover, III; Douglas A. Sorensen; Melvin Sharp

[57] ABSTRACT

A byte-wide memory with column redundancy. The redundant columns can each be substituted for any column in the half-array, without regard to which bit position the defective column relates to. Fuses store the address information of the defective columns, and when a match between the externally received column address and the stored defective-column-address is found, the sense amplifier for the bit position which contains that defective column is disabled, and the output of the redundant column (selected by whichever word line is activated) is multiplexed into the I-O buss. Thus, before the row address signal has even been decoded, the defective column has been disabled and one of the redundant columns has effectively been substituted. This configuration means that it is not necessary to have one redundant column for every bit position, but each redundant column can substitute for a defective column in any bit position, and more than one defective column in a single bit position can each be replaced.

24 Claims, 16 Drawing Figures

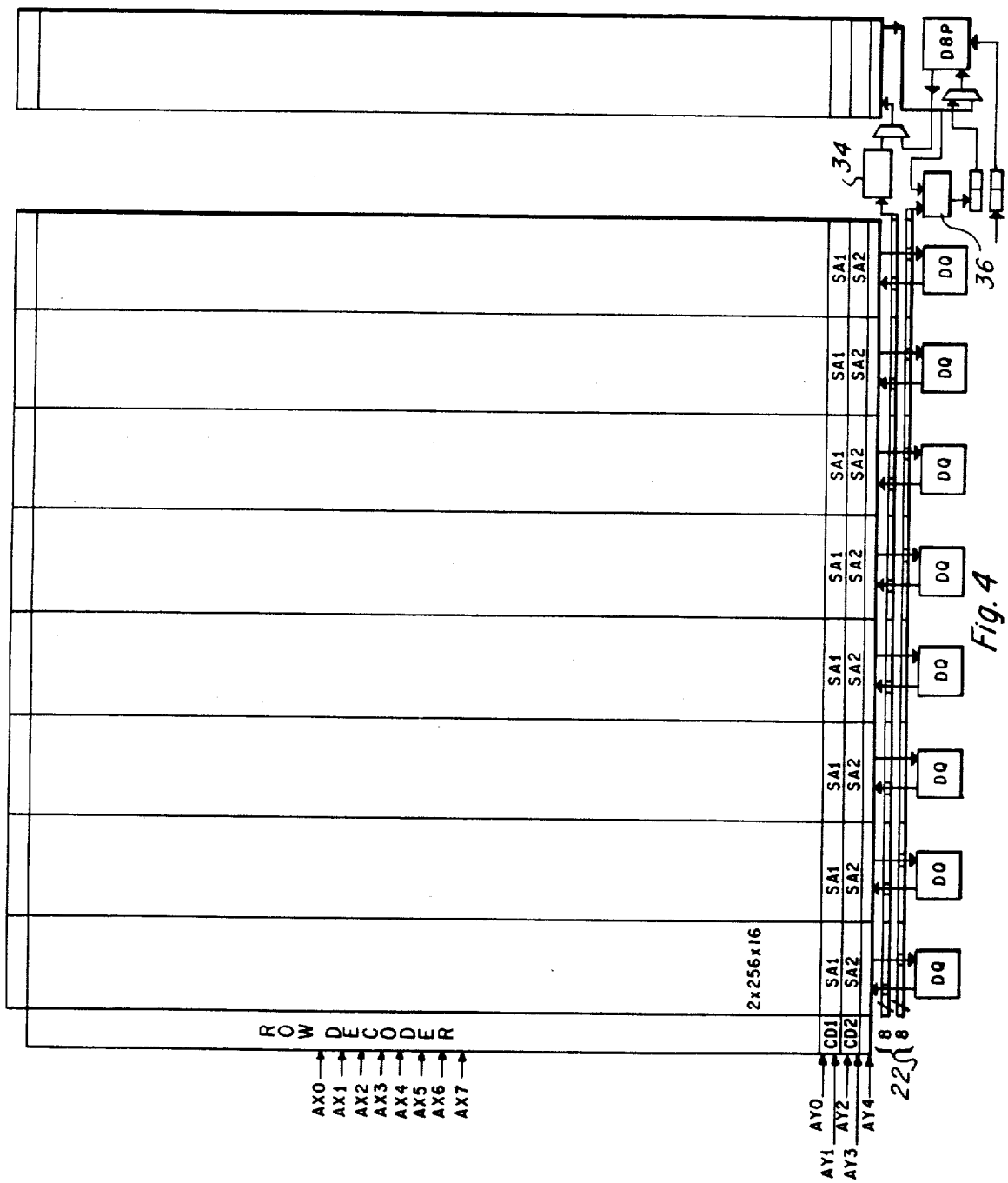

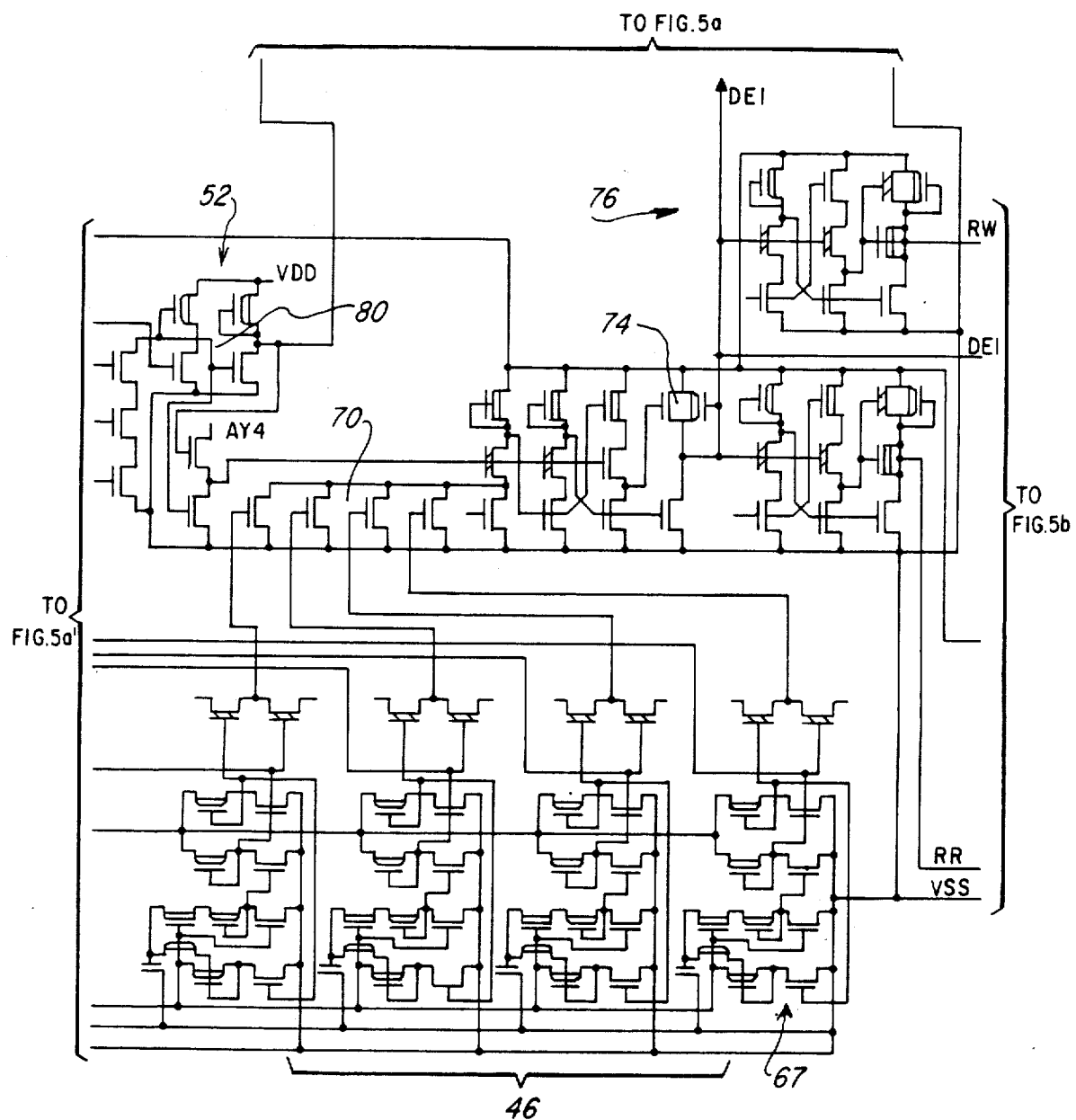
Fig.5a"

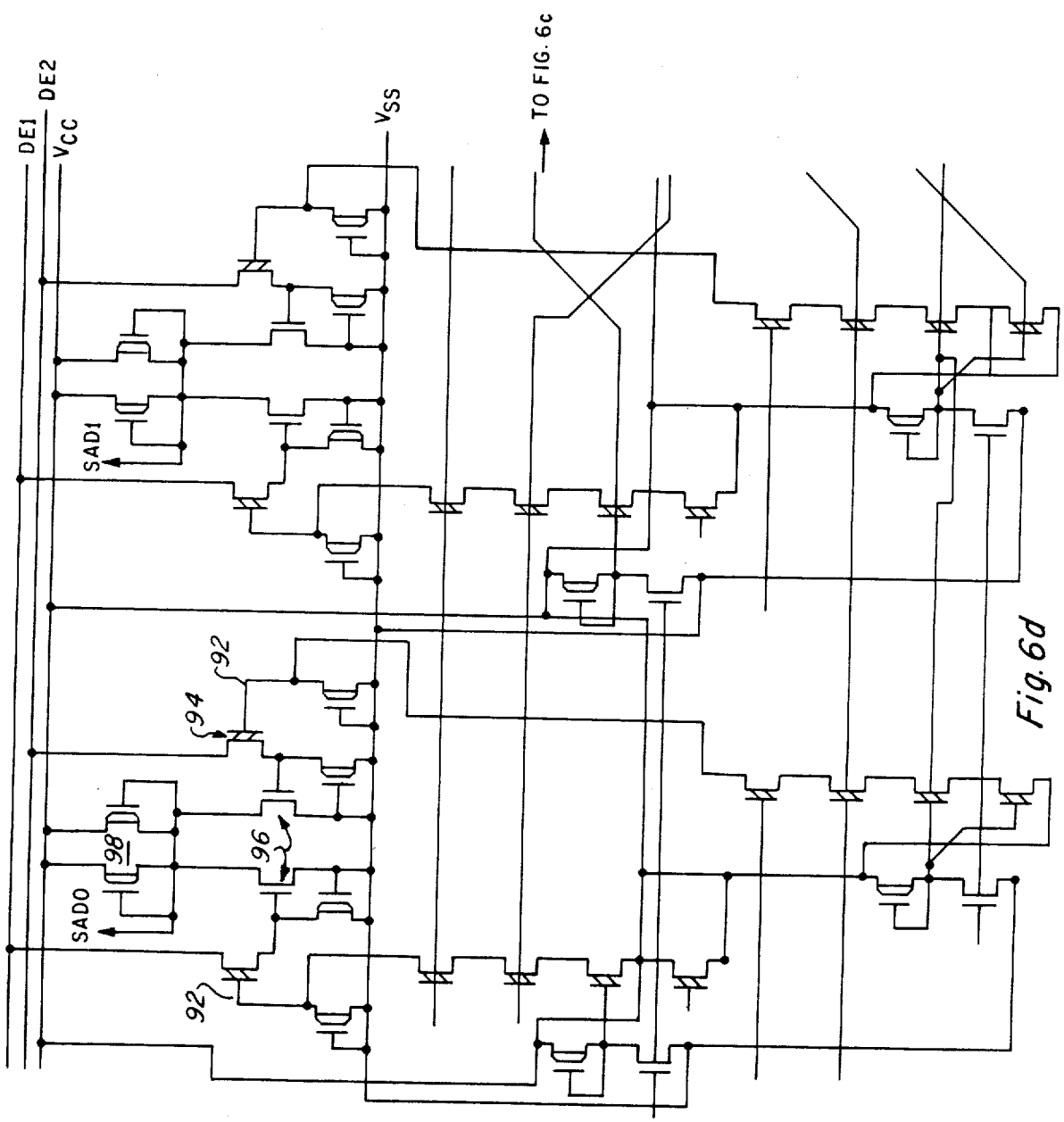

MEMORY WITH REDUNDANCY

BACKGROUND AND SUMMARY OF THE INVENTION

The present invention relates to semiconductor memories. In particular, the present invention relates to semiconductor memories having redundancy thereon. In particular, the present invention relates to semiconductor memories which are organized to output more than one bit simultaneously, e.g. to a memory which is organized according to nine-bit bytes, so that each read cycle provides nine bits of information simultaneously at nine I/O pads.

As is well known in the art, there are substantial advantages to byte-wide memory organization. ("Byte-wide" is frequently used to refer only to by-8 memories, but is used in the present application to refer to any memory which is more than one bit wide.) This reduces the board-level overhead, and in general provides additional convenience to the system-level designer.

A further known desideratum in large memories is redundancy. Most bad memory chips at reasonable maturity of process have only a few bad bits. If these bad bits can be replaced by redundant elements, yield improvement can be obtained. Initially when yields with an aggressive design are small, redundancy can enhance the yield by as much as an order of magnitude. Even in a mature product the loss in yield due to increased chip area is likely to be offset by yield improvement due to repaired chips.

Memory chips which are organized as byte-wide are particularly desirable for small systems. Where the whole memory requirements of a sub-system can be satisfied with, e.g., three or four 64k memory chips, it would be exceedingly wasteful to go to a memory board using a by-one organization. A further advantage of byte-wide chips from a designer's point of view is in expandable memory configuration systems. That is, where a board can be used with various memory size options, and the smallest option is at most a small multiple of the number of bits per chip, it is much more efficient from the system designer's point of view to be able to use byte-wide memory chips.

One method of implementing redundancy in a byte-wide memory would be to have a whole redundant block, which could be substituted for one redundant bit position. That is, for example, in a 4k×9 half-array, one entire 16 column by 256 row block could be provided as a redundant bit position which could be substituted for any bit position which happens to contain one or more defects. However, this approach is not only tremendously wasteful of area, but also would not solve the problems of defects in more than one bit position.

It is desirable to minimize the row decode delays, which means (preferably) minimizing the length of word lines. In a large memory, this means that the memory is preferably partitioned in subarrays. This in turn means that redundancy is preferably provided separately for each subarray. The present invention could be implemented in an embodiment where a redundancy block was shared between subarrays, but this is not preferable due to the increased complexity of wiring, and at chip-level logic (i.e. subarray-select logic).

A byte-wide memory could be organized as, for example, two half-arrays each containing nine bit positions. Each "bit position" is a set of 16 columns side by side, all of these columns (with their respective 16 primary sense amplifiers) being multiplexed into a secondary sense amplifier corresponding to that bit position. Thus, where there are 256 rows, each half array contains 16×256 nine-bit words and each of these words can be provided from the half array as a completely parallel output.

However, there have heretofore been difficulties in combining these two improvements. That is, it has not been practical to configure a byte-wide memory having redundancy.

Thus it is an object of the present invention to provide a byte-wide semiconductor memory having redundancy.

A problem in the prior art of redundant memory circuits is the conservation of wiring space. Redundant memory designs have typically been modifications of memory designs which do not incorporate redundancy. This subsequent modification of an existing design is likely to induce great pressure on the available wiring space on the chip.

It is an object of the present invention to provide a memory, incorporating redundancy, which requires only a minimal amount of metal wiring to embody the redundancy.

In particular, it would be relatively simple to provide one redundant column for each bit position, but this approach is far from optimal, for a least two reasons. First, this occupies an excessive amount of real estate with redundancy circuits. That is, in an 8k×9 memory at least nine redundancy circuits would be required (or, even worse, 18, if each bit position includes columns in each half-array), rather than the 2 or 3 redundant columns per array unit which would otherwise be desirable. A second problem is that this approach would be hopeless in the case where more than one defective column is found within a single bit position. That is, in a 4k×9 half array, of those half arrays which have exactly two defective columns, approximately one-ninth of them will have the two defective columns located in the same bit position. Thus, a significant fraction of defect cases could not be fixed by this approach.

A further reason for using column redundancy rather than row redundancy is that upper-level metal patterning is typically a lower-yielding process than polysilicon, polycide or first-level metal patterning. That is, upper level metal patterning is not only subject to much more topographic excursion, but metal patterning in general is less intimately involved in cell area and is therefore typically not as intensively refined as polysilicon patterning processes. Thus, patterning defects which will cause a whole column of the memory array to fail are more likely than patterning defects which will cause a whole row to fail. That is, defective bits are not randomly distributed, but exhibit an anomalous correlation along the column access, and the redundancy mechanism should replicate this for optimal efficiency.

In conventional memory architecture, column redundancy is generally preferable to row redundancy. That is, metal is typically used for the bit lines, whereas the word lines are usually made of polysilicon or some other higher-resistance material. Thus, the bottleneck in access time is the row line delays. Thus a small amount of logic can be incorporated in the column-selection circuitry without increasing the total accessing delay of the memory, whereas no such additions can be made to the row-line logic. For this reason, it is preferable to incorporate both the logic for byte-wide parallel access and also the logic for redundancy in the column organization. It would obviously be easier from a design standpoint to organize these along orthogonal axes of the array, but this would increase the total delay of the memory, and is therefore not acceptable. However, it should be noted that, even if the physical organization of these elements can not be orthogonal, their functions are properly orthogonal. That is, a redundant column should preferably be capable of substitutions for any column in any bit position in the array, and multiple redundant columns should be capable of independent substitution decisions, including substitution for multiple columns at a single bit position of the array.

It is an object of the present invention to provide a semiconductor memory having byte-wide organization by columns and also having redundant columns which can each be substituted for any defective columns within any one of multiple bit positions.

It an object of the present invention to provide a semiconductor memory organized in sub-arrays each containing columns corresponding to two or more bit positions, and each subarray containing a plurality of redundant columns which can each be substituted for a defective column in any bit position of that sub array.

One important constraint on the memory system which incorporates redundant columns available to any bit position in a byte-wide memory is the relative timing between select and deselect. It is important that the defective column be deselected before it can again provide erroneous output information, when its address is accessed. That is, it is desirable that the defective column should be disabled before the row access time has elapsed. It is also preferable, to avoid excessive delay, that the redundant column should be enabled before the row access time has elapsed. Finally, it is also desirable that the defective bit position be disabled before the redundant column is enabled. This is not strictly necessary, but is a desirable precaution to avoid the possibility of the sense amplifier of the defective column fighting against the sense amplifier of the redundant column, which could lead to excessive current on the buss and possible damage to the devices.

It is an object of the present invention to provide a semiconductor memory having byte wide column organization and column redundancy, wherein a predetermined defective column position is always disabled prior to enablement of a redundant column which replaces that defective column position.

Many of the problems of redundant memories are most easily solved in laser-selected redundancy, wherein a laser (or electron beam) can destroy interconnects or devices at essentially any position on the chip. That is, the problem of overhead circuitry is immensely simplified when the whole chip area can be spatially addressed during an independent redundancy programming process, and high-current pathways can be made or broken. However, the problem with such approaches is that they require an expensive and slow processing step which is preferably performed prior to final packaging of the device. Thus, not only is throughput greatly degraded, which sacrifices many of the advantages of redundancy programming in the first place, but since subsequent processing is required after redundancy programming, defects which first manifest themselves during the subsequent processing steps may not even be compensated for or even detected.

The alternative to such externally spatially-addressed redundancy programmation schemes is electrical redundancy programmation typically using a fuse-blowing operation. That is, after the chip has been probed, on-chip fuses using thermal-write/electrical read mechanisms (such as blowing a thin polysilicon fuse link or spiking through a junction) are used to change the static voltage on certain circuit nodes. (This can even be done after final packaging, if sufficient pin-outs are provided, but is preferably done at the multiprobe stage.) Not only are these electrically written mechanisms limited to certain circuit nodes, but also the read mechanisms thus used are typically low-current, so that amplification and buffering stages must be used to provided useful outputs. High voltage for such electrically-accessed programmation steps may be externally supplied or may be generated on chip, or (which is slightly more difficult) fusible devices which will reliably self destruct at normal power supply voltages may be used, although these must be carefully positioned.

Thus it is an object of the present invention to provide a byte-wide semiconductor memory having column redundancy, wherein the redundancy information programmation is electrically accessed.

It is an object of the present invention to provide a byte-wide semiconductor memory with column redundancy, wherein the redundancy information programmation can be performed after final packaging.

The present invention teaches a semiconductor memory including multiple bit positions in each subarray, wherein each bit position contains several columns of memory cells. When the memory is read out, one bit will be read out at each bit position, from a bit within one of the columns which are located at that bit position. Fuse information is programmed, after the memory has been probed, to indicate which columns in the subarray are defective. For each redundant column, a separate address decoder block continually tests the input column addresses received by the memory, to see if one of the column addresses received corresponds to the unique defective column in one particular bit position which that redundant column has been programmed to replace. The sense amplifier at the bit position in which the accessed column is defective is then disabled, a sense amplifier for the redundant column is enabled, and a multiplexer connects the output from the redundant column sense amplifier to the appropriate output buss so that the information read out from the redundant column is inserted at the appropriate bit position in the output word. This operation can be seen more clearly in the following specific example, although the present invention is certainly not limited to the preferred embodiment or to any of the specific features thereof.

The preferred embodiment uses a 8k×9 memory array which is partitioned into two 4k×9 sub arrrays. Each 4k×9 sub array contains nine bit positions, each including 16 columns, each containing 256 bits accessed by respective wordlines. Each subarray also contains two redundant columns, each with its own fuse-programmed redundancy information. One bit of the input address is used to select which half array is to be accessed, and this first one-bit decode step is preformed at higher-level array overhead. Therefore the following discussion relates to only one of the sub arrays, i.e. to a 4k by 9 subarray containing nine bit positions of 16 columns each. Suppose that, for example, a particular subarray contains a defective column (which may contain only one defective bit, or may contain many defective bit locations) in column 3 of bit position 1, and also contains another defective memory column at column 6 of bit position 2. The input address will contain four bits which specify the column position (i.e. which specify some one of the 16 columns in each bit position), and will also contain 8 bits to specify one of the 256 rows. Suppose, in this example, that column one and row one is selected by the address input. Then, in each bit position, column 1 of the 16 available columns will be activated, and the first cell in that column (selected by wordline WL1) will be selected. The information contained in the cell at row one of column one at each of the nine bit positions will be fed into the nine primary sense amplifiers which correspond to those nine columns, the output of those nine primary sense amplifiers will be connected to nine respective secondary sense amplifiers, and the output of those nine secondary sense amplifiers will be provided to output busses which lead to the I/O buffers, amplifiers, and external contact pads. There is one primary sense amplifier for each column of cells, i.e. 16 primary sense amplifiers for each of the nine bit positions, but there is only one secondary sense amplifier for each four primary sense amplifiers, i.e. a total of 36 secondary sense amplifiers. At each bit position one of the four secondary sense amplifiers is multiplexed onto the output buss. Thus, information corresponding to nine bits will simultaneously appear on the contact pads of the device.

In this same example (where the defective columns are column 3 of bit position one and column 6 of bit position 2), let us suppose that the address information externally received now corresponds to row 100 and column 3. In this case, the address decoder in the logic associated with the first redundant column will detect that a match has occurred (on column 3) but no match will be detected by the logic associated with the second redundant bit. Four fuses in the redundant column store information which indicates that column 3 is defective in one of the bit positions. Four more fuses are used to encode information which shows exactly which bit position contains the defective column. Thus, once an address match with the defective column address has been detected, the logic in the first bit position then accesses one of nine disable blocks. (The disable block is a novel circuit taught by the present invention, which will be described in more detail below.) In effect there are nine disable blocks, one for each bit position. The bit position information in the first redundant column logic is used to select which of the disable blocks a disabled signal will be provided to. In this case, a disable signal is provided to the disable block at bit position one. The disable block at bit position one is connected to the secondary sense amplifier at bit position one, and disables this sense amplifier, so that no information whatever can be placed onto the bus from the 16 columns included in bit position one.

Thus, the first operation performed in this case by the first redundant circuit logic is to disable the bit position at which a defective column was about to be addressed. A second operation was also performed to properly substitute the information stored in the memory cells of the redundant column for the information which was contained in the defective column, namely column three of byte position one. That is, redundant column one contains 256 memory cells, accessed by the same wordlines as the memory cells in the other 144 columns of the main memory of the half-array. This row of memory cells has its own primary and secondary sense amplifiers, and the secondary sense amplifier incorporates a disable circuit (as do the secondary sense amplifiers for the 144 primary columns of the half-array). When an address match to the column address stored in four of the fuses for the first redundant column is detected, the sense amplifier for this redundant column of memory cells is enabled. Thus, when the wordline for the selected row (number 100 in this example) finally goes high, the bit stored at position 100 in the redundant column will be accessed, and the primary and secondary sense amplifiers of redundant column number one will amplify the information which was stored in this memory cell. The information stored in the remaining four fuses of redundant column one now selects which of the output busses the output of a secondary sense amplifier of the redundant column will be connected to. A simple one-of-nine multiplexer accomplishes this.

All of the foregoing operations are completed before the delay normally associated with word line decoding and access has expired. That is, after an address transition (when both the row and column inputs provided from the external pins of the memory package typically change), it will typically take 2-5 NS for the address buffer to change state, and 5-6 NS thereafter until the column decoders raise lines corresponding to the selected column. In the present invention, the secondary sense amplifier of the disabled column (column 3 in the above example) will also be disabled at about this time. About 7-10 NS later, the redundant column will be enabled. Thus, all of these events have occurred in a total delay of about 15-20 NS after the address transition at the input pads. However, it will typically not be until 4-5 NS after the address buffer transition that the row decoder will change state, and, due to wordline delay, it will typically not be until an additional 4-5 NS later that the row-selected memory cell in each column is accessed. Typically another 15-20 NS will be required for the sense amplifiers to change state. It should be understood that all of these timings are approximate, contingent, and in no way essential to the present invention, but they are incorporated here to provide some understanding of the general characteristics of operation of the present invention.

It should be noted that the byte-wide redundancy implementation of the present invention is relevant to any semiconductor memory, that is to static rams, dynamic rams, nonvolatile rams, EPROMS, EEPROMS, or to other memory types. The presently preferred embodiment relates to a static ram, but the invention is also applicable to all of these other types. A further feature of the present invention, which is important in most but not all of these other memory technologies, is the write control. That is, the operation described above relates to the read operation of a memory retaining a redundant column, but the control of the write operation of a redundant-column byte-wide memory also presents significant problems. It is necessary that any write cycle which attempts to write information into a defective column should in fact write that information into the corresponding cell of the particular redundant column which has replaced that defective column. Thus, in a write cycle in the present invention the detection of the address match on the accessed column is the same as above. That is, if redundant column one replaces column three in bit position one, then whenever a write into (e.g.) cell number 100 in column three is attempted, the information of bit one of the nine bit word which is sought to be written into the memory must be written into redundant column one rather than into column three of bit position of the main array.

The write operation in this case will be described, again by way of example rather than as any necessary limitation. An address match between the column address ("3") and the information stored in the column address bits in the fuses of redundant column one will first be detected. When this match is detected, the write buffer for redundant column one will be enabled. The second four bits of redundancy information stored in fuses and in redundant column one will again be used to control a multiplexer, which is now demultiplexing the nine bits of the input buss into the write buffer. That is, in this example, the second four bits of stored fuse information say that the bit position at which column three is defective is bit position one. Therefore, the input buss which contains information being sent into the chip will provide the appropriate bits to be stored in the main array (in row 100 of column three) for each of bit positions two through nine. However, the multiplexer will connect the input buss line corresponding to bit position one into the write buffer of redundant column one. This write buffer is connected to the sense amplifiers for redundant column one, so that the externally-generated information corresponding to bit position one of the word being stored in memory is latched onto the bit lines of the first redundant column, and therefore, when word line 100 eventually goes high, the stored information in cell 100 of redundant column one will be written over by the externally received information. Thus, when a later attempt is made to read out the word stored at row 100 of column three, the correct information for the first bit of this word will be stored in redundant column one.

A further important advantage of the present invention is that the demands on metal wiring area are minimized. Only those signals which require high speed are routed through metal wiring to accomplish the redundancy function, and the other signals are routed through moat levels. That is, in effect, the bit position output from each redundancy logic block is maintained as a dc signal, which is coupled to the disable block for each bit position by conductive paths at the moat level. These dc signals are decoded to provide a dc signal which, for each redundant column, controls a pass transistor. Each pass transistor controls a connection, for only one bit position, between the output of the address-match detector in the redundant column logic and the disable logic in the sense amplifiers corresponding to that bit position. Thus, only one high-speed connection is provided from each redundant column logic to all the disable blocks, and thus only one metal wire is required. This extreme efficiency in conserving metal wiring means that redundancy according to the present invention can be retrofitted into a wide variety of prior art byte-wide memories.

Thus the present invention provides a byte-wide memory with column redundancy. The redundant columns can each be substituted for any column in the half-array, without regard to which bit position the defective column relates to. Fuses store the address information of the defective columns, and when a match between the column address and the stored defective-column column address is found, the sense amplifier for the bit position which contains that defective column is disabled, and the output of the redundant column (selected by whichever row line is activated) is multiplexed into the I-O buss. Thus, before the row address signal has ever been decoded, the defective column has been disabled and one of the redundant columns has effectively been substituted. This configuration means that it is not necessary to have one redundant column for every bit position, but each redundant column can substitute for a defective column in any bit position, and more than one defective column in a single bit position can each be replaced.

According to the present invention there is provided:

A memory comprising:

a plurality of memory cells arranged in rows and columns, said columns of memory cells being organized by bit positions, each bit position including more than one of said columns of memory cells and at least one sense amplifier;

at least one redundant column of memory cells, and a sense amplifier operatively connected thereto;

at least two output means, said output means being connected to respective ones of said array sense amplifiers to provide simultaneous data output corresponding to memory cells at different ones of said bit positions;

redundancy select logic storing defect position information, including both defective column address information and also bit position defect information indicating which of said positions includes said defective column;

and wherein said redundancy select logic connects said redundant column sense amplifier to said output means corresponding to the one of said bit positions which is encoded by said bit position defect information, wherever said externally received column address matches said stored defective column address;

and wherein said array cells, said redundant cells, said sense amplifiers, said output mens, and said redundance select logic are all integrated on a single chip.

According to the present invention there is also provided:

A memory array comprising input means, output means, and a plurality of subarrays, each memory subarray comprising:

A plurality of memory cells arranged in rows and columns, said columns of memory cells being organized by bit positions, each bit position including more than one of said columns of memory cells;

At least one sense amplifier for each of said bit positions, whereby respectively independent bits of information are selectively provided as output from more than one of said bit position simultaneously;

At least one redundant column of memory cells, and a sense amplifier connected to each said redundant column of said memory cells;

At least two output means, said output means being connected to respective ones of said array sense amplifiers to provide data outputs corresponding to different ones of said bit positions;

An address decoder, connected to receive externally generated row and column addresses, said address decoder being connected to a plurality of said bit positions sense amplifiers to access a plurality of memory cells, each corresponding to said externally received row and column addresses, at more than one of said bit positions simultaneously;

Where said redundancy select logic stores defect position information, said defect position information corresponding to the position of a defective column in said array of memory cells, said defect position information including both a column address corresponding to said defective column and also bits indicating which bit position includes said defective column;

Wherein said redundancy select logic is operatively connected to said address decoder, to monitor said externally received column addresses and to detect whenever a match occurs between one of said externally received column addresses and said stored defective column information;

And wherein, whenever said redundancy select logic has detected a match between said external column address and said stored defective column address information, said redundancy select logic connects said redundant column sense amplifier to said output means corresponding to the one of said bit positions which is encoded by said bit position defect information;

And wherein said array cells, said redundant cells, said sense amplifiers, said output means, and said redundancy select logic are all integrated on a single chip.

BRIEF DESCRIPTION OF THE DRAWINGS

The present invention will be described with reference to the accompanying drawings, wherein:

FIG. 4 shows the layout of one 4k by 9 half-array, including partly logic, in the presently preferred embodiment;

FIG. 5 including

DESCRIPTION OF THE PREFERRED EMBODIMENTS

The presently preferred embodiment of the present invention is a 8k×9 static random access memory (SRAM), which is divided into two 4k×9 subarrays. Each subarray contains 144 columns, grouped in nine bit positions each containing 16 adjacent columns, plus two additional redundant columns which can substitute for any one of the 144 columns in the main portion of the subarray. This embodiment will be described in great detail, but the present invention is of course not limited to this embodiment. The present invention is applicable not only to nine bit wide memories, but also to memories which are four bits wide, 8 bits wide, 20 bits wide, or whatever. Moreover, the present invention is not limited to memories which are divided into two subarrays, but is also applicable to memories which are not divided into subarrays, and to memories which are divided into three or more subarrays, as long as each subarray contains columns corresponding to more than one bit position. Moreover, the present invention is not limited to SRAMs, but is also applicable to DRAMs and to a wide variety of other memory technologies.

Figure 1:
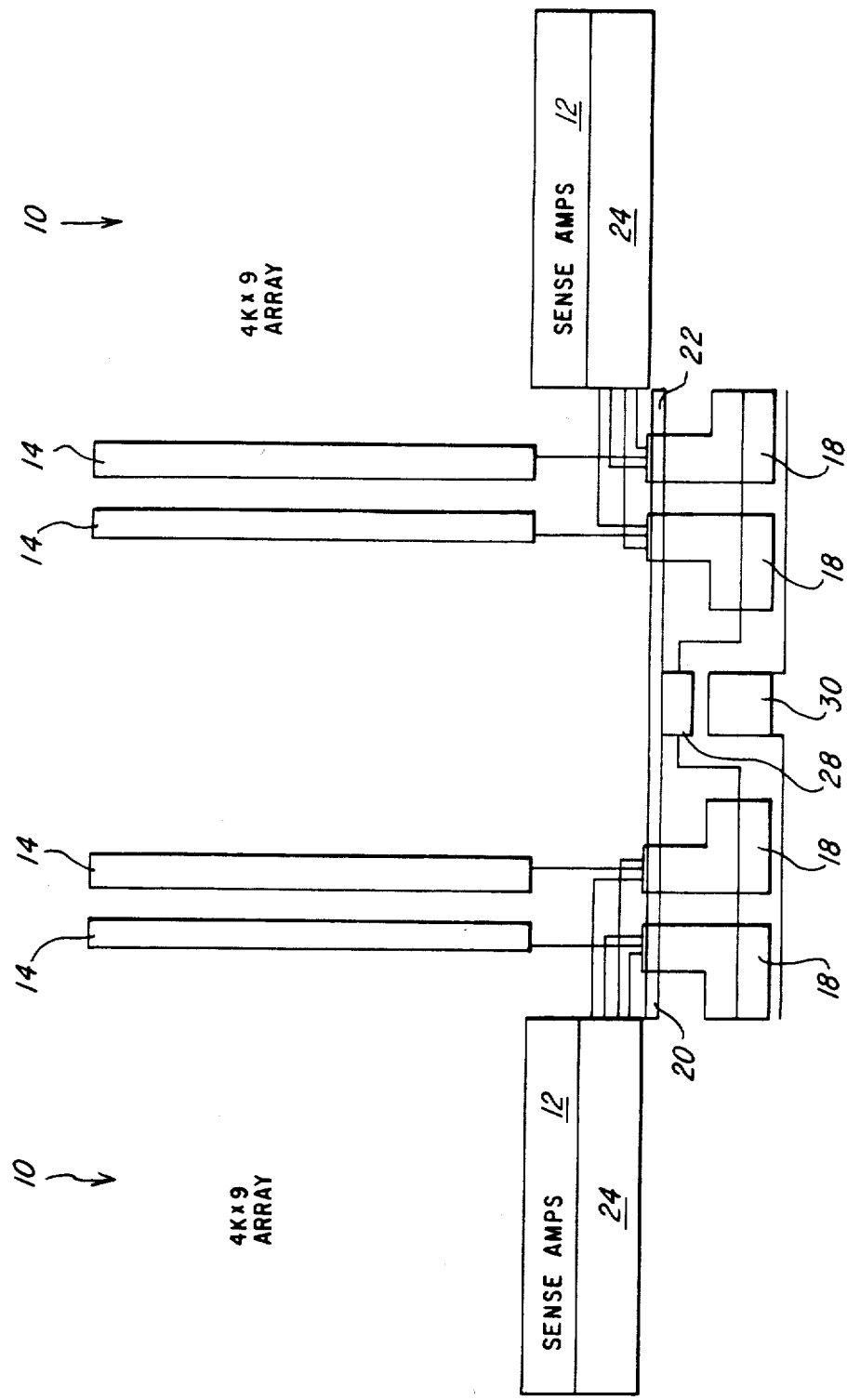
FIG. 1 shows a block diagram of the principal components of the circuits used to achieve column redundancy in a byte-wide memory or subarray.
Figure 2:
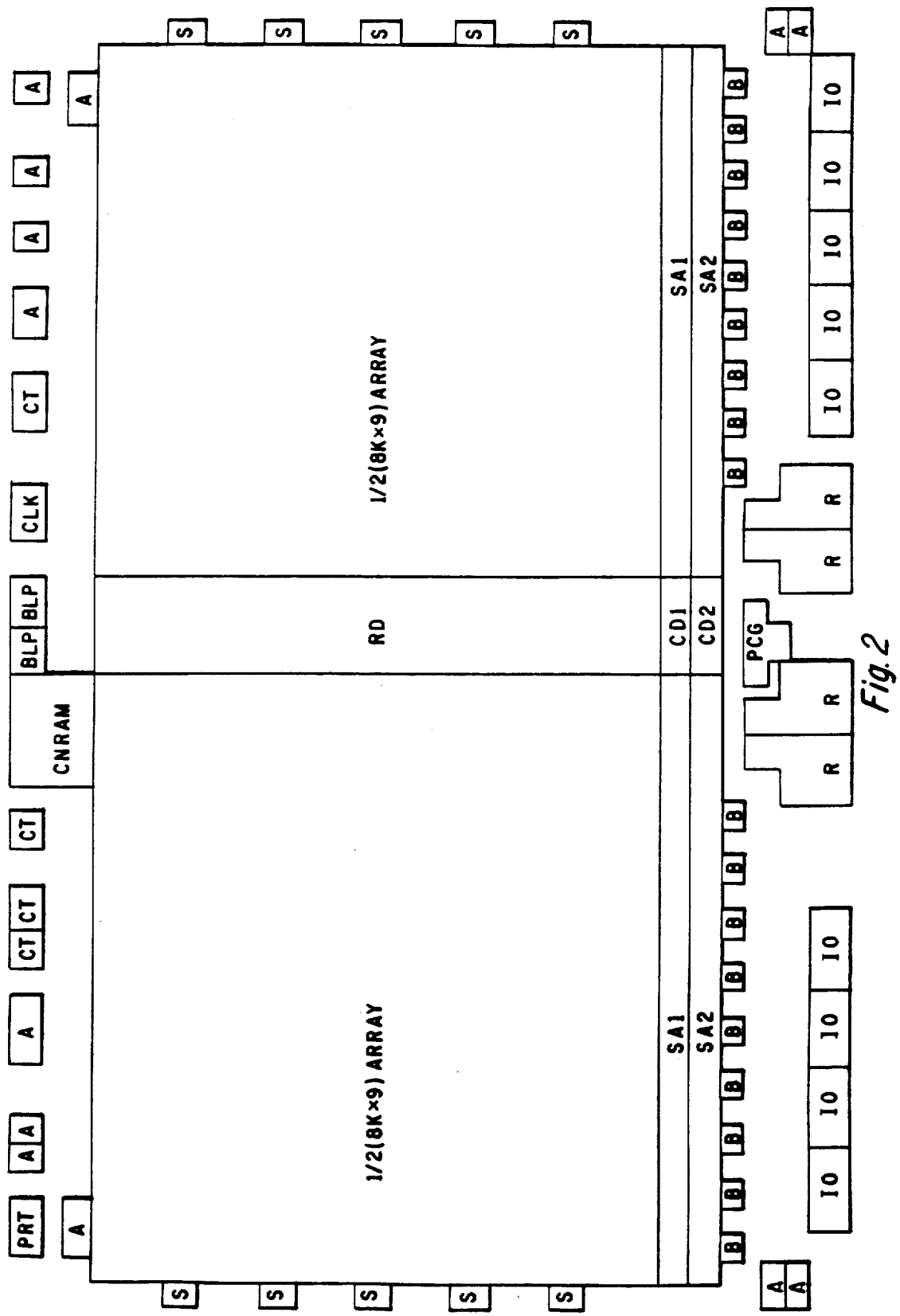
FIG. 2 shows a block diagram of the presently preferred embodiment of the present invention, wherein an 8k×9 SRAM is configured as two 4k×9 subarrays, each containing two redundant columns.
Figure 3:
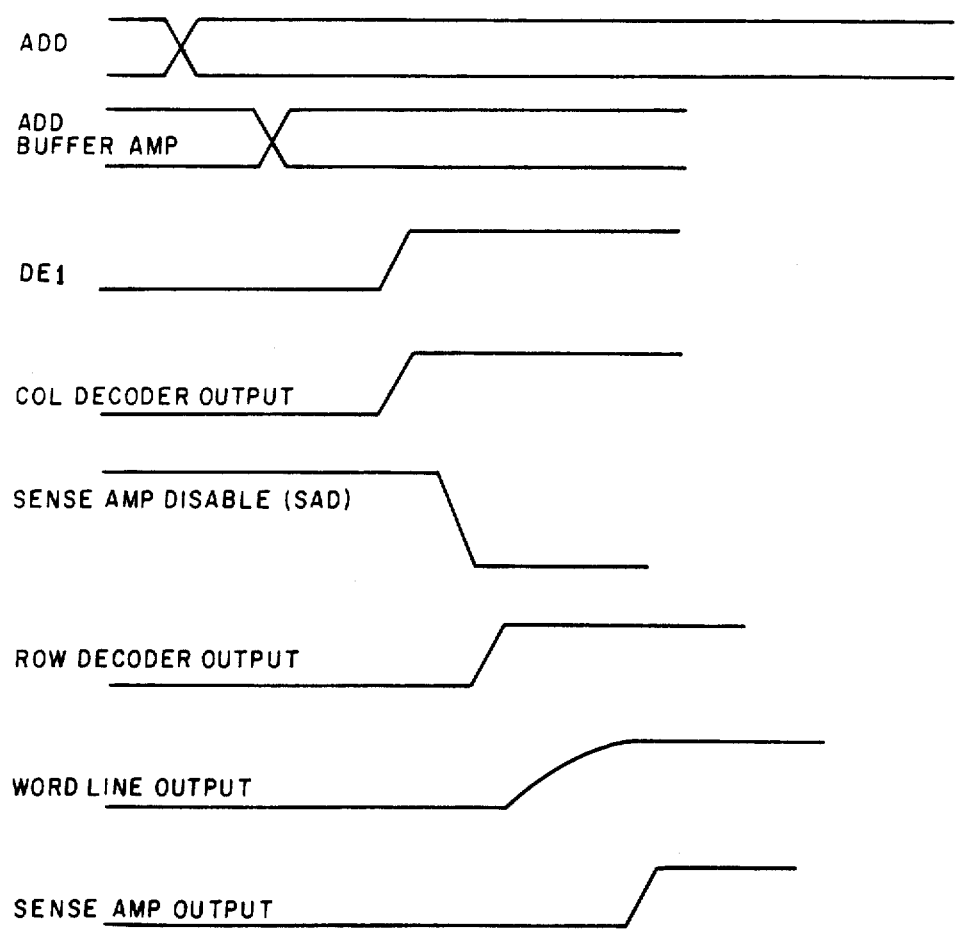
FIG. 3 shows a conceptual timing diagram, used in explaining the operation of the present invention.

FIG. 1 shows an approximate physical layout of various key portions of the present invention in the presently preferred embodiment. That is, two subarrays 10 of static random access memory cells are provided, each subarray having sense amplifiers 12. In each subarray, two redundant columns 14 are provided. Each redundant column 14 is connected to a redundancy select circuit 18. The redundancy select circuits 18 are connected to two disable blocks 24, one for each memory subarray. Each disable block 24 is connected to the corresponding set of sense amplifiers for that half array. These disable blocks 24 are connected to the redundancy select circuits 18 as well, in order to selectively disable the sense amplifiers SA2 (FIG. 2) only for those bit positions which are indicated by signals received from one of the redundancy select circuits 18. The redundancy select circuits 18 are also each connected to one of the columns of redundant memory cells 14, and are also connected to one of the buss lines. The buss has two halves 20 and 22, which are not entirely common across the left and right sides of the chip. However, the busses do contain 9 lines for input data, 9 lines for output data, and other lines which will be discussed below. These data busses are connected to conventional I-O buffers, amplifiers, and output pads, which are not shown in this drawing. Nine output lines are provided, due to the provision of the presently preferred embodiment for parity generation and checking, which will be discussed below.

In addition, in the present embodiment, each redundancy select circuit 18 also contains electrical fuses. In order to initially program these fuses, control logic 28 labled as UCKT is provided, to provide a signal VPL to the redundancy select circuits 18 when it is necessary to write information into the fuses. Moreover, a contact pad 30 is also provided, for the special purpose of applying a high voltage VPH (e.g. 25 volts) for the purpose of blowing fuses during the fuse write operation in this embodiment. In the presently preferred embodiment, the VPH and substrate pads are not bonded out. That is, these contact pads are not connected to pins in the final package. Fuse programmation must therefore be performed before packaging, using a probe to contact the VPH pad.

FIG. 4 shows the bit position organization of the right half array of the preferred embodiment in slightly more detail. Note that nine bit positions are provided, each bit position including 16 columns of memory cells. In the preferred embodiment, each column contains 256 rows of individual memory cells, but this is of course not a necessary detail. It should be noted that, from the 8 bits of input data which are provided on the input lines of the buss portion 22, a parity generation circuit 34 generates a ninth parity bit, which is stored in the ninth bit position. When data is read out, the parity check block 36 immediately checks the parity of the stored information, so that any failure in data integrity is likely to be detected immediately. However, this feature of parity generation and checking is certainly not any necessary feature of the present invention, since the present invention can be as well applied to, for example, an 8k×8 memory, very similar to that of the presently preferred embodiment, which does not include parity generation and checking.

Figure 5A:
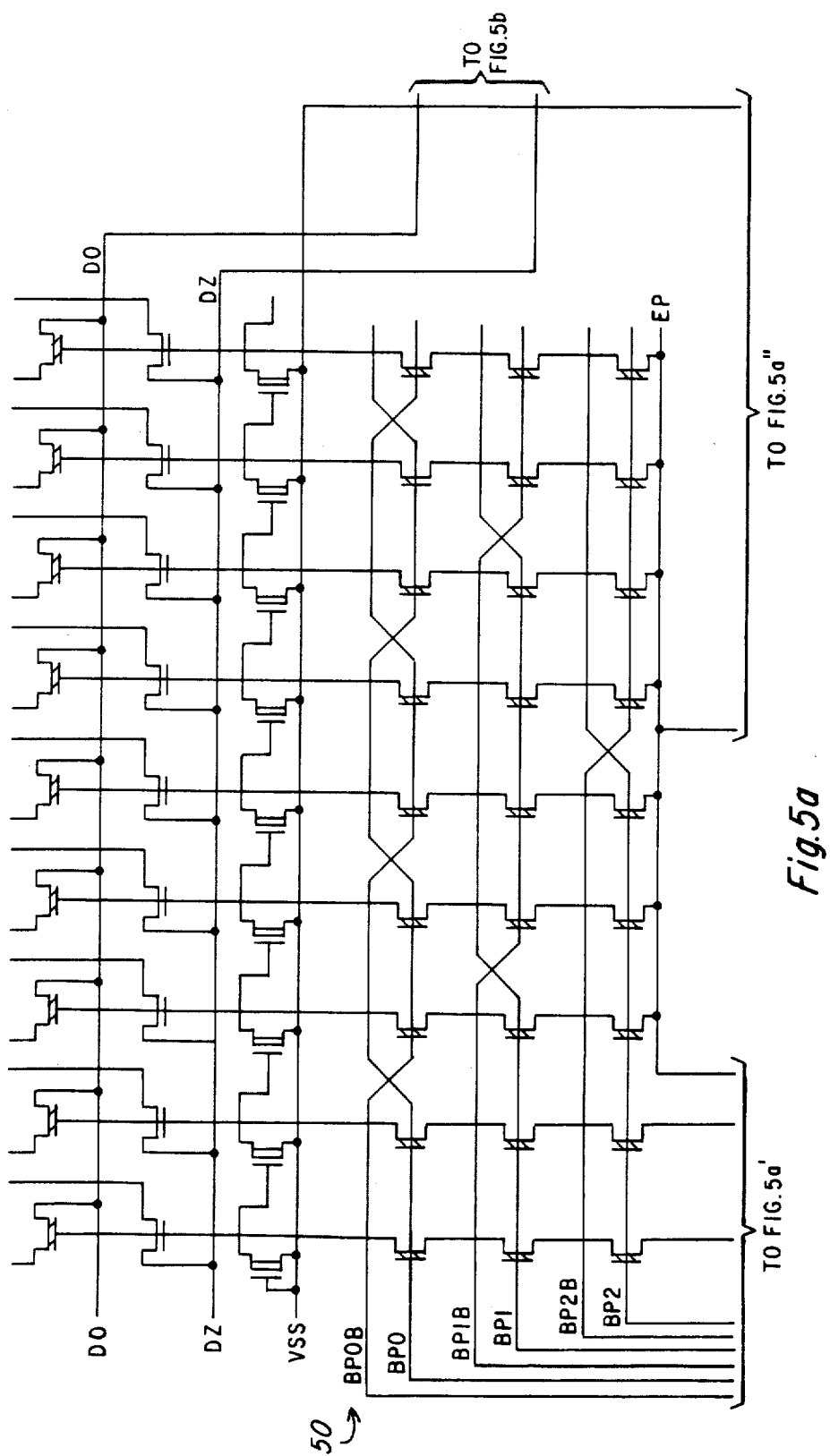
FIGS. 5a and FIG. 5b, shows the circuit layout, referred to as "FUSE 8", which is used for each redundant column in the preferred embodiment of FIG. 1.
Figure 5A:
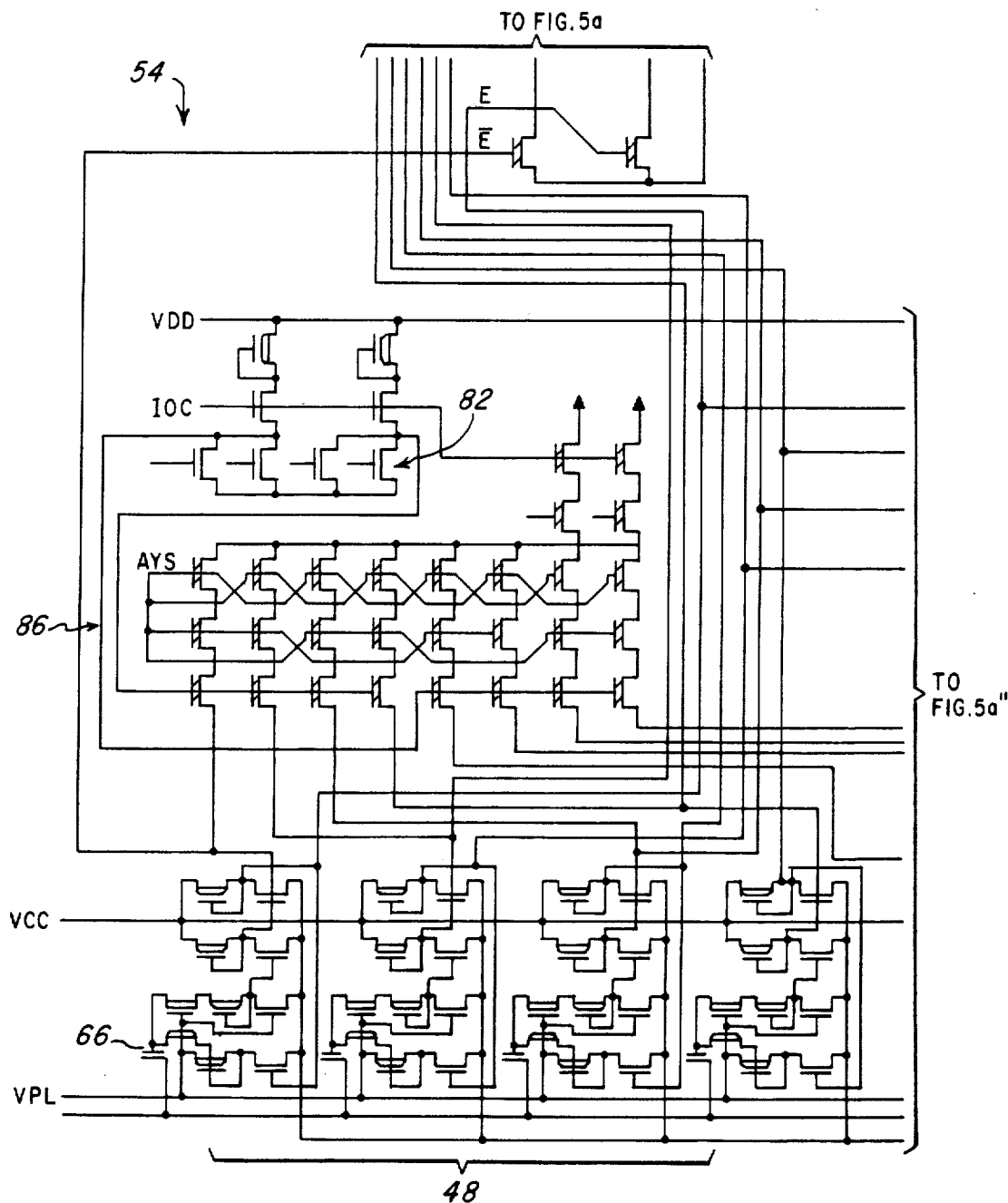
Figure 5B:
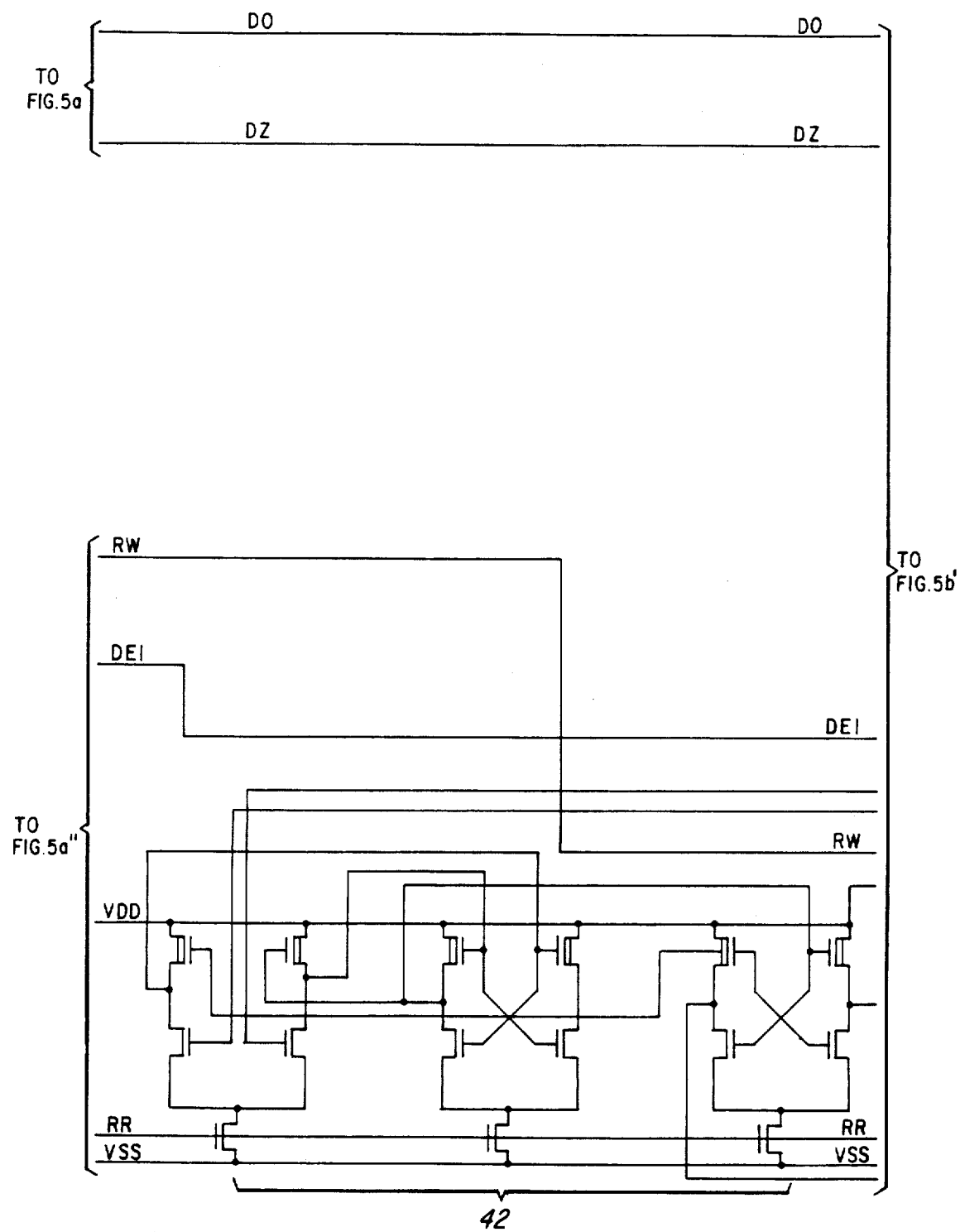
Figure 5B:
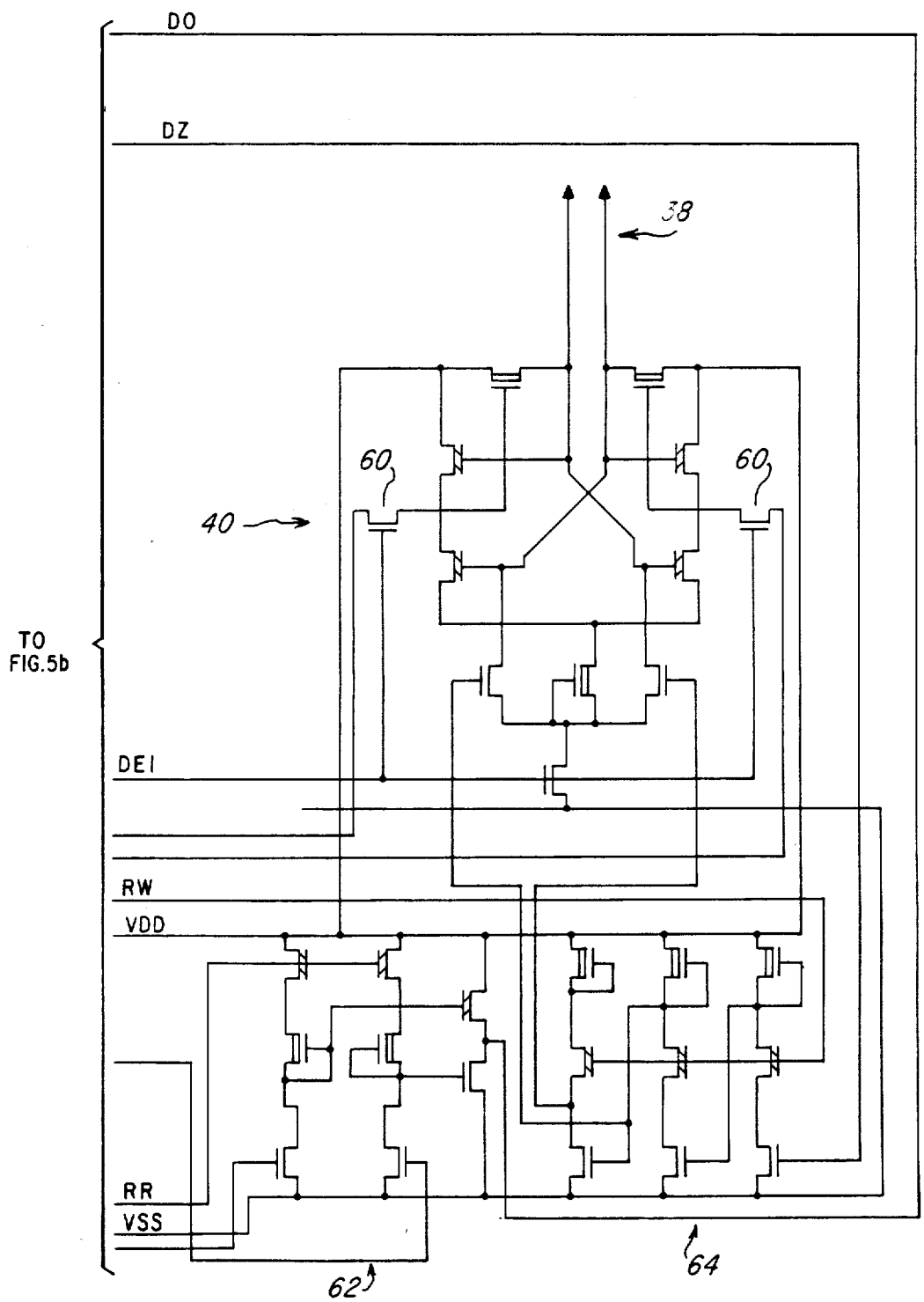

FIGS. 5a and 5b shows a schematic of the redundancy select circuit 18 of the presently preferred embodiment, which is labeled as "FUSE 8" in many of the drawings. A pair of bit lines 38 connects this circuit to the redundant column 14 shown in FIG. 1. The complementary signals received on these bit lines are amplified by a primary sense amplifier 40 and a secondary sense amplifier 42, and can then be read out. Crucial portions of this redundancy select circuit are the address match block 44 and the multiplex block 50.

Before going further into the operation of the redundancy select circuit 18 (fuse 8 block), we may recall that the memory of this sample embodiment is organized as two subarrays, each subarray containing 9 bit positions, each position storing 16 columns of 256 bits each. Thus, referring to FIG. 14, one address bit AY4 selects whether the right half or left half of the array will be accessed. Eight address bits AX0-AX7 select one of the 256 rows. The other four Y address bits AY0-AY3 select one of the 16 columns which is found at each bit position in each half-array. Each redundancy select circuit 18 includes eight fuses which specify exactly which column in the half-array is to be replaced by the information stored in the redundancy column associated with that particular redundancy select circuit 18. Fuses BP0-BP3 indicate which of the nine bit positions in the half-array contain the column which is to be substituted for, and the four fuses A0M-A3M (referenced as fuses 46) indicate which column, within the 16 columns of the defective bit position, the redundant column is to substitute for.

Thus, in the normal operation of the array, the bit AY4 will select one of the half arrays, and the four bits AY0-AY3 will select one column at each of the nine bit positions, while bits AX0-AX7 select one f the 256 rows within the selected column, at each bit position. The fuses 46 encode bits AY0M-AY3M which indicate a defective column address. The address match block 44 continually monitors the input addresses AY0-AY3, and, when a match is detected between the bits AY0-AY3 and the stored fuse bits AY0M-AY3M, the address match block 44 then enables further operations of the redundancy select circuit 18.

The defective bit position bits BP0-BP3, referred to by reference numeral 48, indicate which one of the nine columns of the array contains the defective column at an address indicated by bits AY0M-AY3M. Thus, when an address match is found, the address match circuit 44 provides a disable signal over a disable line DE1 or DE2. (In each subarray, the two redundancy select circuit blocks 18 each have their own disable line DE1 or DE2 respectively.) These disable lines are preferably metal lines, so that a fast signal is provided.

Meanwhile, the bit position fuses 48 have continuously been providing a DC output signal which shows which of the nine bit positions contains the defective column encoded by the defective column bits 46. These four bits are amplified and provided as a DC output over lines BP0B, BP1B, BP2B and EB, which are shown in FIG. 5. These lines are preferably configured as moat lines, since they are low speed (approximately DC) signals. As will be discussed below, these bit position lines BP0B, BP1B, BP2B and EB are decoded in the disabled block to selectively connect the disabled line DE1 or DE2 for *this* redundancy select circuit 18, to selectively disable the sense amplifier for the bit position encoded by the bit position bits 48. However, note that this sense amplifier is decoded only when the input address bits AY0-AY4 exactly match the fuse-stored defective column bits 46.

The multiplexer 50 connects the output of sense amplifier 42 to one of the output lines 33 in the buss 20, in accordance with the address encoded in the bit position bits 48. Thus, when the address match block 44 indicates an address match, the sense amplifier 42 is enabled, so that, when the word line activates one of the cells which is connected to redundancy bit line 38, the signal thus received will be provided on the output line encoded by bit position bits 48, if and only if the input column address matches the defected column address bits 46.

The enable block 52 is provided to allow for the (hopefully numerous) cases where the redundancy block is not needed at all. That is, four bits 48 are used to encode addresses corresponding to only nine bit positions, and thus it is possible to encode information in the bits 48 which does not correspond to any of the nine bit positions. The enable block 52 continuously monitors the bit position bits 48, and, if these bits have encoded an impossible bit position, the sense amplifier 42 is disabled.

Finally, a fuse read/write block 54 is provided, to permit encoding of the appropriate information in the appropriate fuses 46 and 48. The detailed operation of this logic will be discussed in detail below.

FIG. 5 shows a circuit diagram of the presently preferred embodiment of the redundancy select circuit 18. It should be noted that, in this circuit diagram, MOS devices having diagonal lines shown between the gate and channel are those devices which have a threshold voltage of approximately 0.2 volts. Devices which are shown as depletion devices, and which are also shown with slanted corners at the ends of the channel, have a threshold voltage of approximately −0.6 volts. (These devices receive two threshold implants in the presently preferred embodiment.) Devices which are shown as depletion devices but do not have angled corners (in the drawings) at the ends of the channels, have a threshold voltage of approximately 1.4 volts. Finally, MOS devices shown without any of these embellishments have a threshold voltage of approximately 0.6 volts. Several power supplies are also shown. The $V_{cc}$ supply is five volts, the $V_{dd}$ is 3.3 volts, the $V_{ss}$ is ground and the $V_{bb}$ line, which supplies the substrate bias, is approximately −1 volt. In addition, two other lines labeled VPL and VPH are also shown. The VPL line, which is generated by the UCKT circuit 28, is at 0 volts normally, but is held at five volts in the fuse write mode. The VPH line is a high voltage line connected to its own external contact pad 30, which is supplied with 25 volts during fuse write, but is otherwise forced to approximately Vcc by a natural-Vt device in the VCKT circuit. Naturally, the buss from this 25 volt contact pad is preferably carried for only a short distance over the bar.

FIG. 5 shows one complete redundancy select circuit 18. This circuit is connected to one pair of bit lines 38, which are the bit lines for the redundant column of memory cells. In the presently preferred embodiment, there are 256 cells in this redundant column, and they are addressed by the same 256 polysilicon word lines which run across the 144 columns of the main half-array. The output of this primary sense amplifier 40 is accessed by two pass transistors 60, which are controlled by the disable signal DE1. (We assume here that the redundant column controlled by the circuit of FIG. 5 is the first redundant column. The redundancy select circuit 18 which corresponds to the second redundant column, in each half array, provides a separate disable output labeled as DE2.) The signals from this first stage sense amplifier 40 are connected to a second state sense amplifier 42, which, in this embodiment, contains three additional amplification stages plus a power down inverter 62, to provide a single output line DZ. This output line DZ is provided to the one of nine multiplexer 50, which will be described below. In connection with the sense amplifiers 40 and 42 it should be noted that a write buffer 64 is also provided. This buffer receives a signal D0 from a one-of-nine multiplexer 50, and, if the redundant column write enable signal PW is raised, will be written through write buffer 64 and the first eight sense amplifier 40 into the bit lines 38, and thus into whichever cell in the redundant column is addressed by one of the 256 word lines.

The lower left portion of FIG. 5 shows the eight fuses 46 and 48 which encode the defective column information and the bit position information corresponding to the defective column. Note that each physical fuse 66 also includes an amplification and buffering stage, which provides complementry outputs corresponding to the state of each fuse.

The address match fuses 46 encode information corresponding to bits AY0M-AY3M. Four and gates 68 AND this data with the externally received address bits AY0-AY3. The outputs of these four and gates are provided to a norgate 70. The output of norgate 70 is not pulled down only if an address match has been found. The norgate 70 is connected to a power down buffer 72, wherein the power down signal is provided by the logical product of the half-array selection bit AY4 and the output EP provided from the enable block 52. The two outputs of this power down buffer 72 are level-shifted through a low-threshold-voltage depletion device 74, to provide the disable signal DE1 which, when high, will be very close to the power supply voltage. This disable signal is bussed to the disable block 24 or 26, and is also used in other places within the redundancey select circuit 18. First, the redundant write enable block 76 is configured as another power-down buffer which in effect provides an AND (logical product) output corresponding to the disable signal DE1 and the externally received write enable signal WE. This redundant write enable signal RW is provided to the write buffer 64 discussed above. It is also applied to the pass transistors in the first stage sense amplifier connected to the redundant column bit lines 38 as discussed above. Moreover, it is also applied to a redundant read enable block 78, which comprises a power down buffer which, in effect, ANDs the disable signal DE1 with an externally generated read enable signal WE bar. This redundant read enable block 78 provides a read enable signal RR to the secondary sense amplifier 42 and to the power down buffer 62 therein.

As discussed above, an enable block 52 is also provided, to detect cases where the four bit positions bits 48 have encoded a number which does not correspond to one of the nine actual bit positions.

The enable block 52 generates, at node 80, an OR (logical sum) of two signals: one signal, in this embodiment, corresponds to values of one, zero, and one for the first three bits of a bit position 48. The second signal corresponds to a one value for the fourth bit (the "e") of the bits position bits 48. A complement of this logical sum is generated to provide the enable signal ep.

The rationale of this logical operation in the enable block 52 can be seen by looking again at the structure of the multiplexer 50. The multiplexer 50 is provided with true and complementary outputs from the bit position fuses 48 at each of the nine decoded outputs of this multiplexer, a pair of transistors is selectively used to connect redundant readline DO to the selected one of the nine readlines on the data bus, and its second transistor is used to connect redundant write line DZ to the corresponding one of the nine write lines on the data buss. These nine respective (mutually exclusive) outputs of the multiplexer 50 are accessed by codes of the bit position bits 48 (labeled respectively as b0, b1, b2, and e) of: 1010 for bp0, 1011 for bp1, 0011 for bp2, 0111 for bp3, 1111 for bp4, 1101 for bp5, 0101 for bp6, 0001 for bp7, and 1001 for bp8. That is, the e bit of the bit position information 48 is used solely to distinguish between bit positions 0 and 1. Otherwise, the e bit is required to be "1". Thus, the enablement block 52 enables the whole redundancy select circuit 18 if and only if: the e bit is 1 or the bits b0, b1 and b2 are respectively 1, 0 and 1. Of the 16 possible combinations of these 4 bits, this logical operation describes exactly those nine of them which are represented by one of nine outputs of the multiplexer 50, and any other condition of these four bits means that no legal bit position has been selected, and therefore this redundant column should not be enabled.

It should be noted that the e bit is zero in only one of the legal bit position information cases. That is, if one of the other three fuses is manufactured with a defect, is erroneously written, or contains a defect in its sensing circuit, when the redundant column is not suppose to be enabled, the "zero" value of the e bit will prevent erroneous enablement of redundant column, unless by bad fortune the other 3 bytes happen to have exactly the values 1, 0, and 1.

It should be noted that the multiplexer 50 is encoded with a gray code, that is with a code in which only one bit is changed at a time, for topographical convenience in laying out the required transistors. However, this is certainly not a necessary feature of the present invention. It should also be noted that this multiplexer is configured, with the rest of the chip architecture, to use separate read and write busses on the data buss, so that an independent connection is made between the redundant read line DO in the read buss, and between the redundant write line DZ in the write buss. However, this is also certainly not a necessary feature of the present invention. It should also be noted that the whole multiplexer is controlled by the ep line, so that the multiplexer will not draw any power unless the enablement block 52 has been activated by the bit position information 48.

The redundancy select circuit, in the present embodiment, also contains circuitry for initially writing the state of the fuses 46 and 48.

A fuse I0 enable block 82 is used to enable external read or write of the fuse information. An input signal cf, ANDed with the I0C input, is used in combination with column address bits AY1–AY3, to access the four bit position fuses 48. Similarly, a column fuse access signal cf, together with the same address bits AY1–AY3, is used to access one of the defective column address bits 46.

During fuse writing, the high voltage VPH is supplied to one end of each fuse, via the short VPH buss, and the fuse address logic decoding 86, together with the buffering circuitry adjacent to each fuse 56, selectively pulls down one terminal of those fuses which are to be blown, so that a tremendous current is passed through one fuse from the VPH line to the substrate. It is, of course, essential that the buffer adjacent to each fuse 56 be capable of standing off the high VPH voltage if the fuse is not desired to be blown.

The read-write block 54 also contains a small buss-connection switch: a fuse write signal wf connects the write buss for an arbitrary one of the bit positions (bit position 0 in this embodiment) to the fuse buffer selected by the fuse address decoder block 86, and similarly a fuse read signal rf selectively connects one of the fuse buffer blocks 67 to read line for byte position 0 on the data buss.

Thus, the most important connections of the redundancy select block 18 are of three kinds: first, the multiplexer 50 selectively connects the redundant read and write liens do and dz to one pair of the bit position lines on the data buss: second, a disable signal de1 (or de2 for the second redundant block) is provided to each bit positions's secondary sense amplifier. Third, the bit position information 48 is provided, preferrably via connections in moat, to the disable blocks 24 adjacent to the sense amplifiers 12 at each bit position.

The operation of the disable blocks 24, which are also an important element of the present invention, will now be described in detail.

Figure 6A:
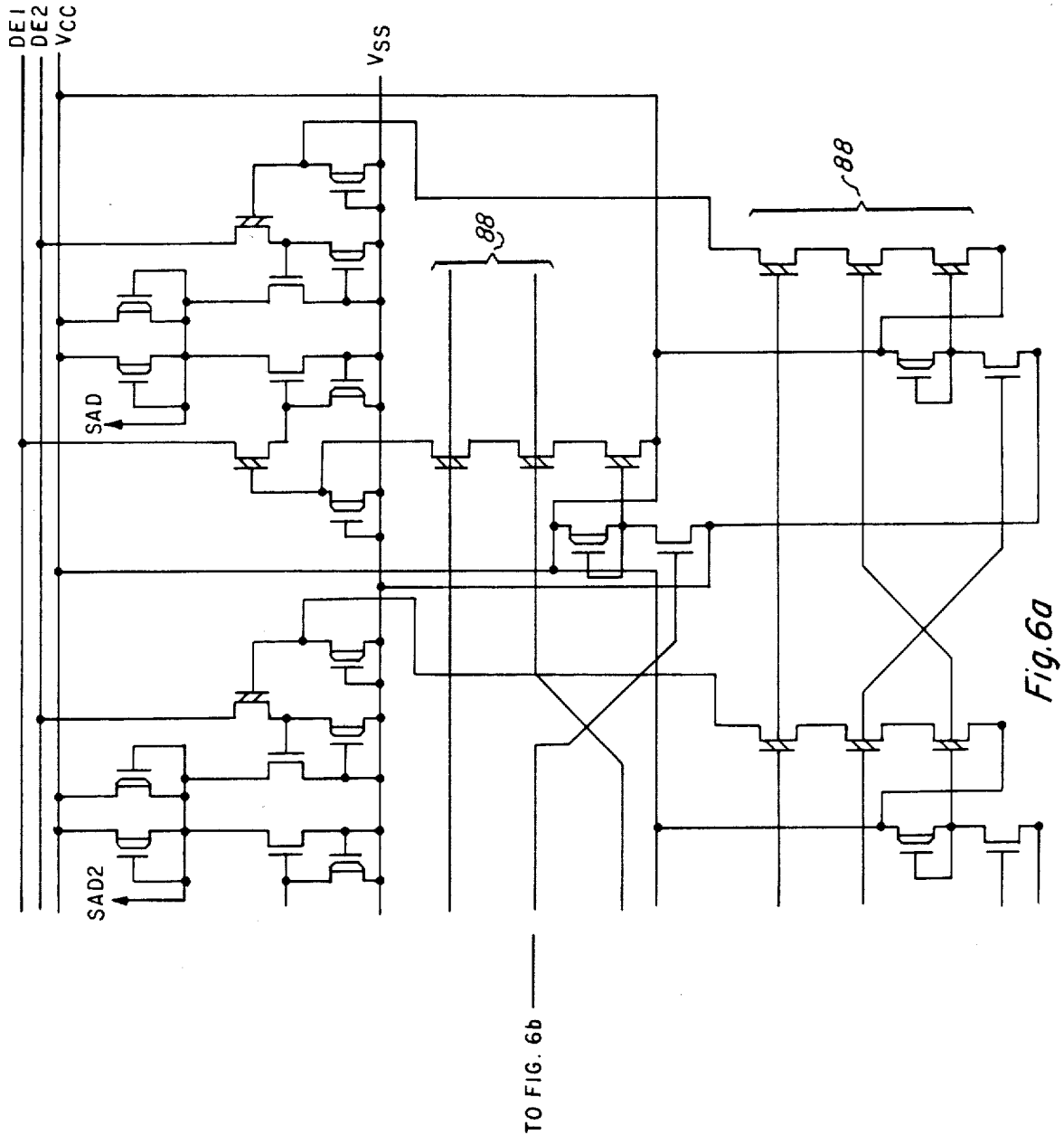
FIG. 6 shows the circuit layout of the disable block (also referred to as block "rbp" or "lbp") which disables the sense amplifier of a byte position for which the column currently being addressed has been instead replaced by one of a two redundant columns, in the preferred embodiment of FIG. 1.
Figure 6B:
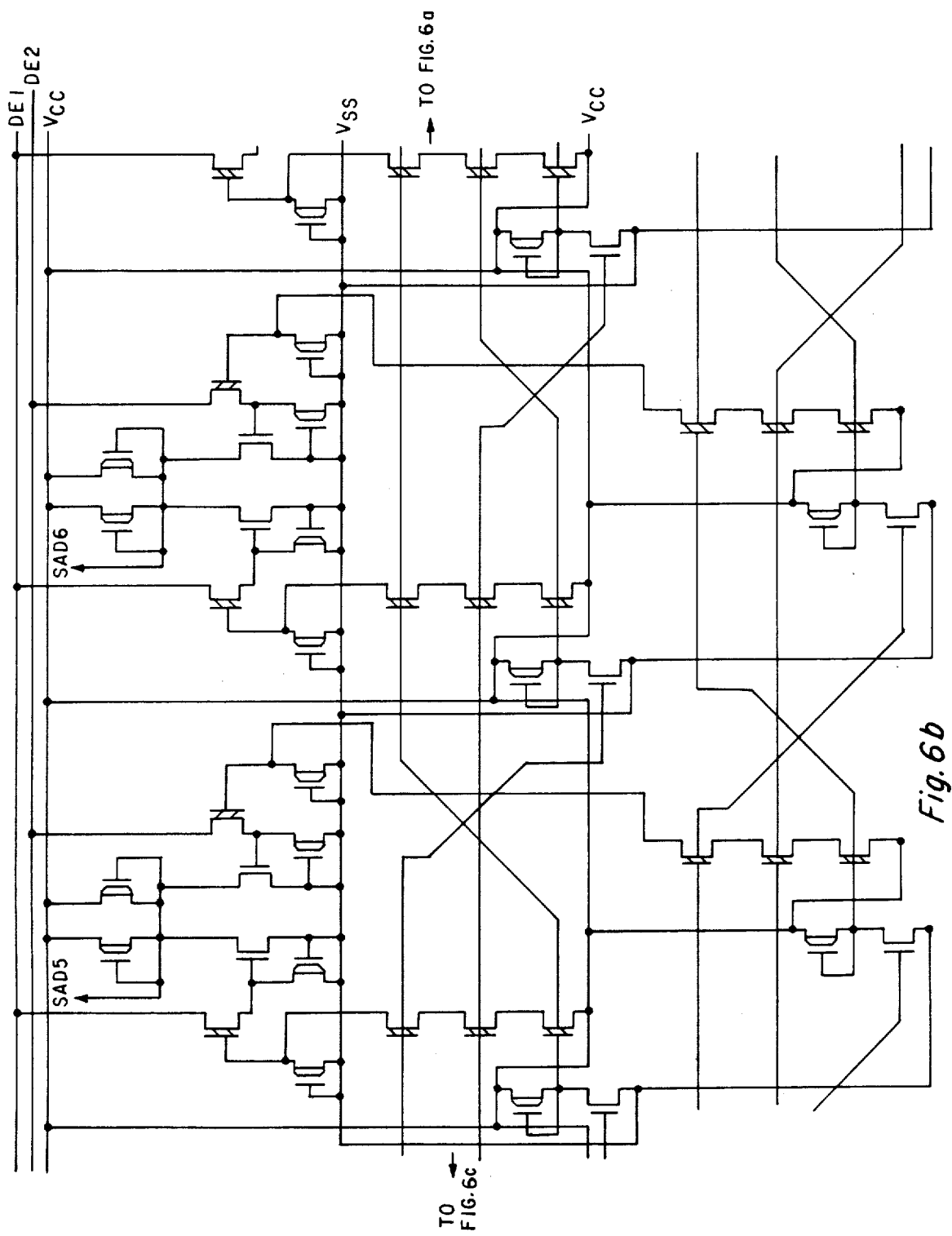
Figure 6C:
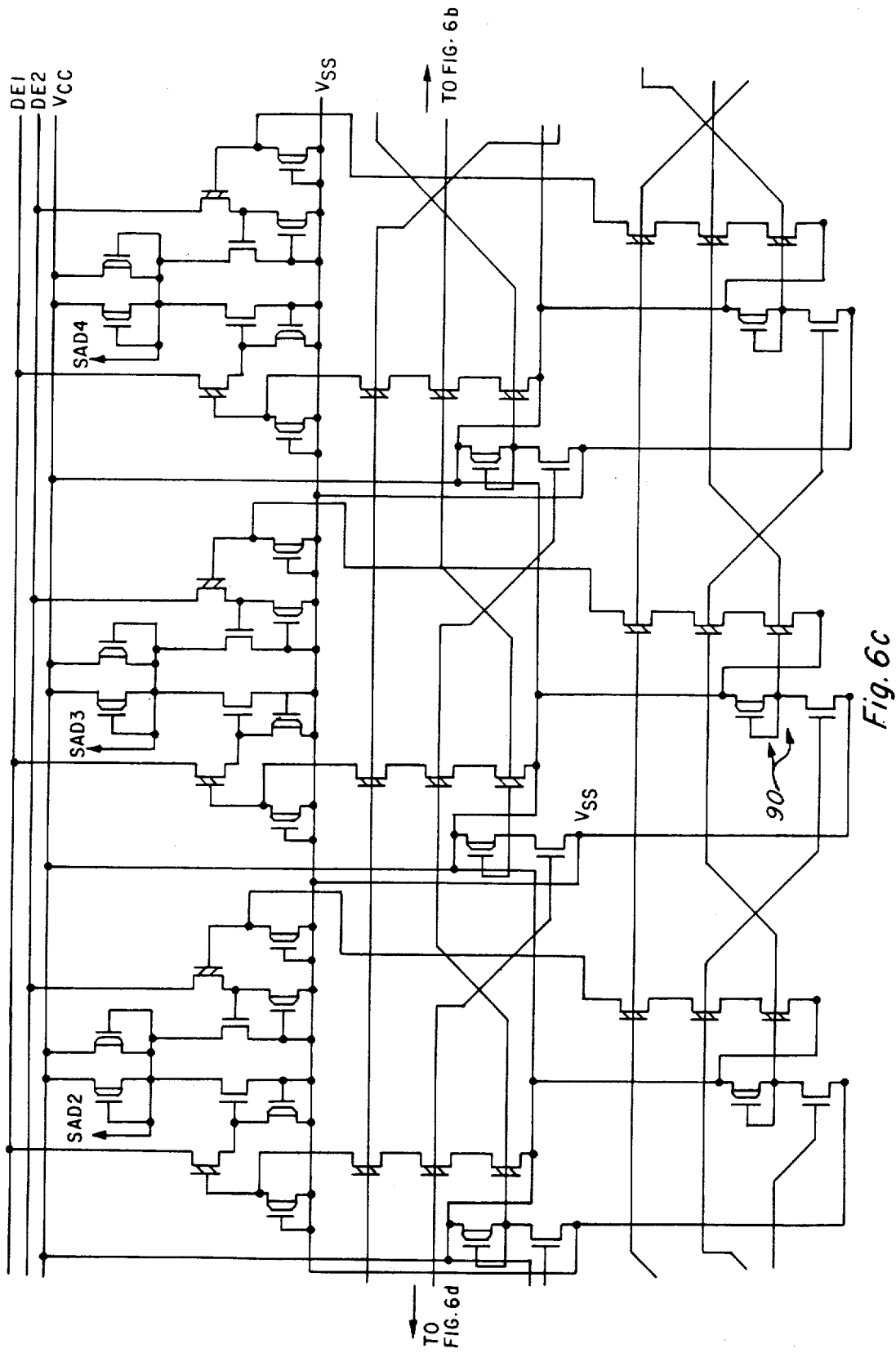
Figure 7:
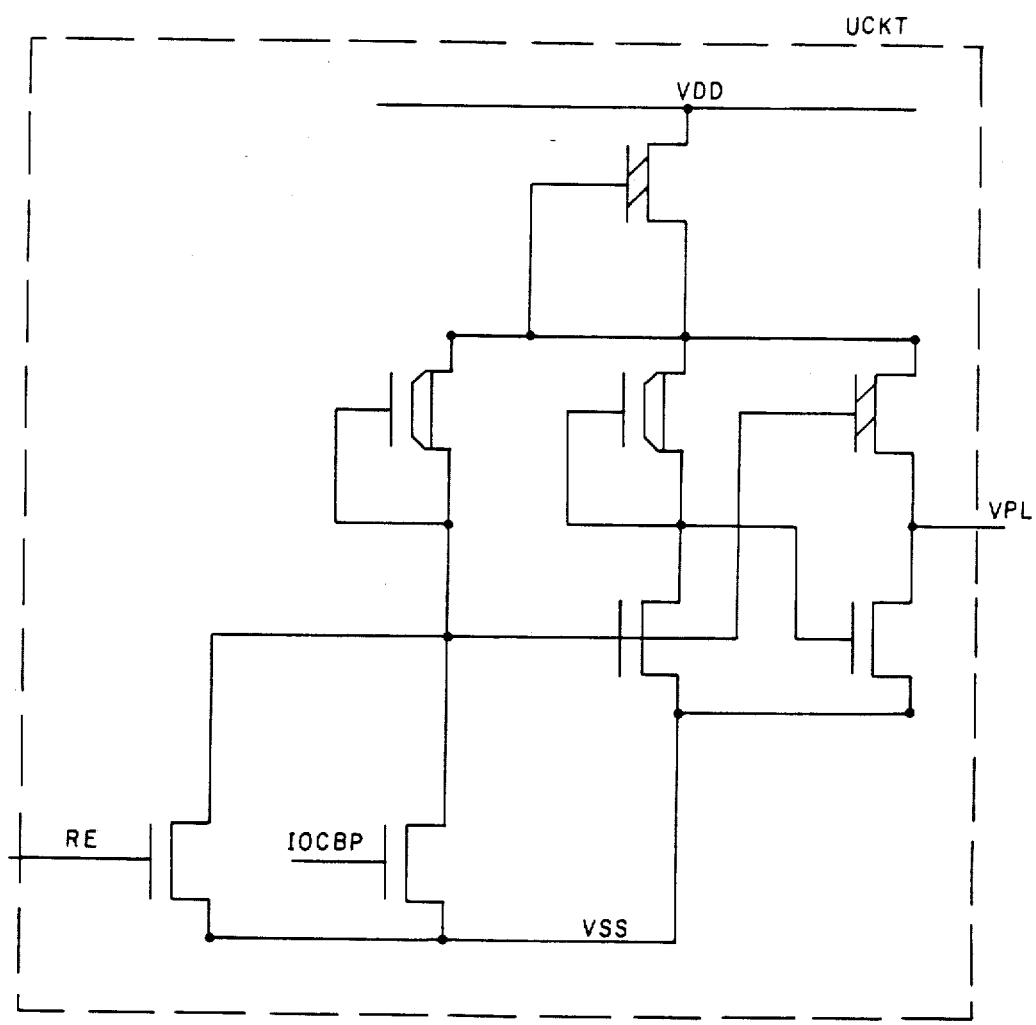
FIG. 7 shows a circuit diagram of the circuit block circuit, which is used to generate the voltage VPL which is used in the fuse-writing programmation step in the presently preferred embodiment of FIG. 1.

The detailed structure of the disable block 20 is shown in FIG. 6. The whole lower portion of this figure consists of two four-byte decoders 88, which are connected to receive the signals from bit position information 48 in the first and second redundancy select blocks 18. The four bits b0, b1, b2, and e which are supplied from the fuses 66 and the fuse buffers 67 in the bit position 48 portion of the redundancy select block 18 for the first redundant column are supplied to the disabled block 24 as the four signals which are labeled in FIG. 6 as the b01, b11, b21, and e1. Similarly, the four signals which are supplied by the redundancy select block 18 of the second redundant column are supplied to the disabled block 24 as the four lines which, in FIG. 6 are labeled b02, b12, b22, and e2. Each of these four bit signals is decoded using a conventional decoder 88. The coding used for the bit positions is the same as that listed above with reference to the multiplexer 50 and redundancy select block 18. Note that this decoder does not require true and complementary signals, but simply generates the complementary signals, of each input bit as required by simple inverter block 90. Thus, each of the decoders 88 provides a high signal to output node 92 for the selected bit positions only. Each of these nodes 92 controls a pass transistor 94, which selectively connects a disable line DE1 or DE2 to the sense amplifier disable line SAD. (The sense amplifier disable line SAD is connected to disable the sense amplifier for the corresponding bit position, which is shown in FIG. 8 and will be discussed in detail below.)

As discussed above, the signals b01, b11, b21, e1, b02, b12, b22, and e2 are essentially dc signals in this embodiment, so that each of the pass transistors 94 is either on or off in a steady state. Thus, the only ac operation in the disable block 24 or 26 as shown in FIG. 6 occurs when the disable lines DE1 or DE2 change state. As discussed above, this occurs only at the beginning or end of a read or write cycle in which the column address AY0 thru AY3 matches the defective column address AY0M thru AY3M stored in the address match information 46 in either the first or second redundancy select circuit 18.

At the beginning of such a cycle, one of the disable lines (for example line DE1) will be brought high. This opens one of the transistors 96, to connect the SAD line for this particular bit position to VSS (zero voltage). Otherwise, the load elements 98 hold the respective SAD lines at a voltage which is almost equal to VCC (five volts).

Figure 8:
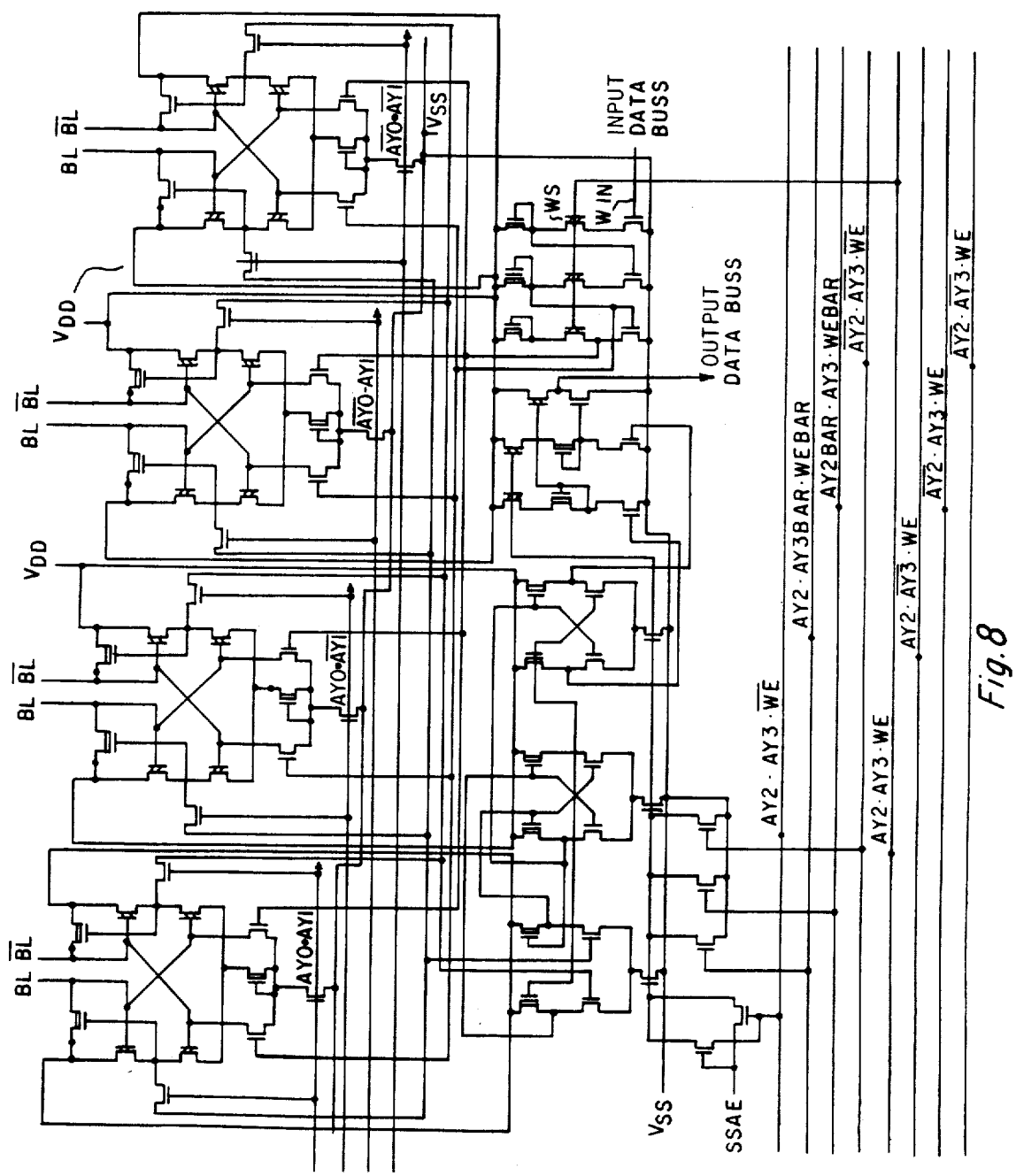
FIG. 8 shows a circuit diagram of one of the four secondary sense amplifiers and four of the 16 primary sense amplifiers preferably used for each bit position of the sub array in the presently preferred embodiment of FIG. 1.
Figure 9:
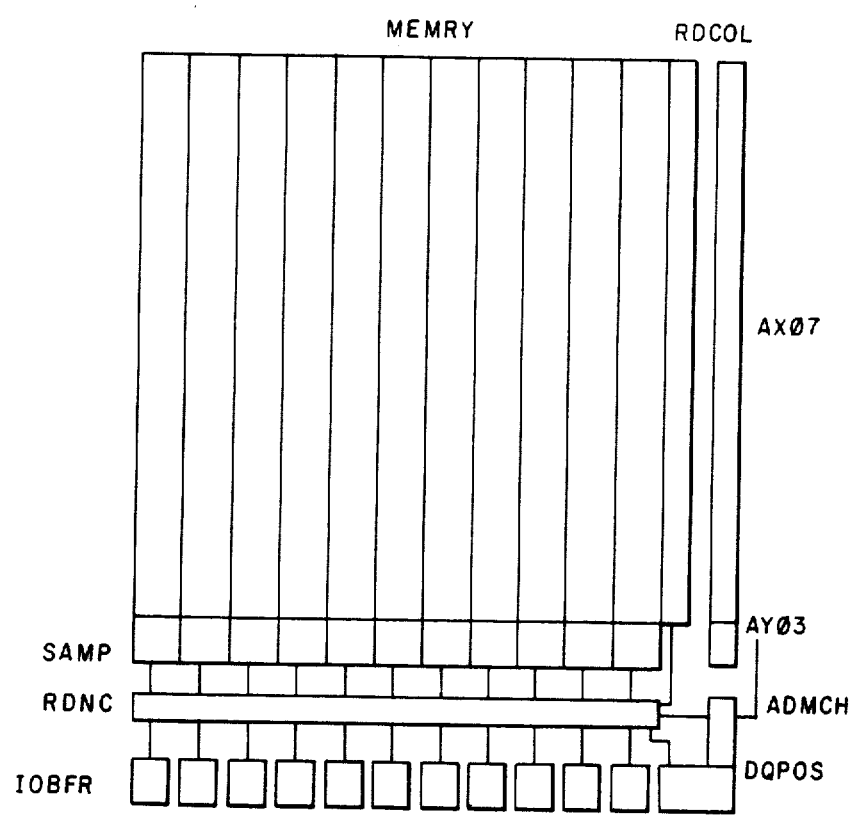
FIG. 9 shows a conceptual block diagram of the present invention, used in indicating how the present invention can be configured for types of memories other than static random access memories.

FIG. 8 shows a portion of the sense amplifier structure used for each bit position in the presently preferred embodiment. The circuit portion showed contains four primary sense amplifiers 100 each of which is connected to a bit line pair 102. (Each bit line pair is connected to 256 conventional static random access memories cells addressed by 256 respective polysilicon wordlines. Two of the column address are decoded to provide four address lines which select one of these four primary sense amplifiers 100 to be connected to the secondary sense amplifier 104. These address busses are shown by the designations AY0 and AY1, AY0 and AY1BAR, AY0BAR and AY1, and AY0BAR and AY1BAR. The signal from the thus selected one of the primary sense amplifiers 100 is applied on a pair of lines 106 to the first amplification stage of secondary sense amplifier 104. The outputs 110 of these amplifiers are applied to a power down buffer 112 which provides a three-state output signal TS0 directly to the readline which corresponds to this particular bit position in the data buss 20 or 22.

The power down signal is applied to the power down buffer 112, as also to the amplification stages 111, by a disable block 118.

The disable block 118 has five inputs. Four of these inputs are provided by the decoded combination of the other two of the column address bits: these lines are labeled as AY2 AND AY3, AY2 AND AY3bar, AY2bar AND AY3, and AY2bar AND AY3bar. The fifth input is provided by the SAD signal for this bit position (e.g. SAD 1), which is provided from the portion of disable block 24 (shown on the circuit of FIG. 6) as described above, which corresponds to this particular bit position. As discussed above, the SAD signal is low if this bit position is to be enabled, and is high otherwise. The disable block 118 is hard wired to decode a particular combination of the decoded address lines AY2 and AY3, and the particular hard-wired configuration shown in FIG. 8 represents values of 0, 1, 1, and 1 for the decoded four lines shown.

Thus, if the address bits AY2 and AY3 indicate that the access column is among the four columns which are connected to this particular secondary sense amplifier 104, and if the SAD line which is connected to all of the four secondary sense amplifiers 104 at this particular bit position has not been pulled low as discussed above, the enable block 118 will provide a high signal on the "power down" line ssae shown. This signal not only enables the amplification stages 118, but also supplies the power down signal to the power down buffer 112. When the ssae signal is high, the power down buffer 112 simply operates as a buffer, and the output TSO simply provides an output signal corresponding to the signal held on the particular bit line pair 102 which has been selected by the address bytes AY0 and AY1. However, when the power down signal ssae goes low, the output TSO of the power down buffer 112 is in a high-impedance floating condition. Thus all four of the secondary sense amplifiers 104 at each byte position can simply be connected in parallel to the appropriate bit position line in the data bus 24 or 26, since only one (at most) of these second stage sense amplifiers 104 will be providing a strongly driven signal at its output node TSO, and the other three secondary sense amplifiers 104 (or possibly all four of these secondary sense amplifiers 104) will hold their outputs TSO in a floating condition, due to the operation of power down buffer 112.

The sense amplifier shown also contains a write buffer 114. Note that this write buffer is not connected to the SAD line in the presently preferred embodiment, so that even a defective column will be written into, although the information in the defective column will never be read. That is, the write buffer 114 contains a line WIN which is directly wired to the line on the right portion of the data bus 24 or 26 which corresponds to this particular bit position, and the write buffer also contains a select gate WS which is hard wired to one of the four write address buses, which contain decoded address bytes ay2 and ay3 ANDed with the write enable signal WE. These four lines are labeled: WE AND AY2 AND AY3; WE AND AY2 AND AY3bar; WE AND AY2bar AND AY3; and WE AND AY2bar AND AY3bar. The complementary outputs of the write buffer 114 are applied to a pair of write transistors 120 in each primary sense amplifier 100. The pass transistors 122 and the pull down transistor 123 and one of the primary sense amplifiers 100 will have been opened by the decoded combination of column address bytes AY0 and AY1 as discussed above. Thus, in this selected primary sense amplifier 100, one of the but lines 102 will be pulled down strongly and information corresponding to the write input data win will be held onto the bit lines 102 to be written into which ever of the memory cells is accessed by one of the 256 wordlines. In the other three primary sense amplifiers 100 at this secondary sense amplifier position, the pull down transistor 123 will not have been turned on, and the write transistors 120 will therefore have no effect.

It would of course be possible to modify the write buffer so that the SAD line could also disable the write operation in a defective column, but this is not deemed necessary in the presently preferred embodiment.

The presently preferred organization of the buss on the left and right sides of the chip is shown in FIG. 4, merely to show additional details of the presently preferred best mode in the present invention.

Thus, the organization and operation of the presently preferred embodiment may be summarized as follows:

In large memories, even bad bars have most of the bits good. Hence, considerable yield improvement is possible if these bad bits can be replaced by some good bits. There are at least two schemes of introducing redundancy. These are governed by the cost of implementing redundancy in terms of extra real estate, extra power and speed penalty. Extra real estate is used for the means of storing information and for circuitry required for switching in the good bits. Further, depending on expected types of failures redundant elements introduced are either entire rows, entire columns or a mix of the two rather than individual bits. Laser implementation introduces several polysilicon links that can be broken by application of a laser. Since the area of implementation is not large, a large number of fuses are included in series path. In electrical implementation, since the area required for each individual fuse is large, the total number is minimized and additional circuitry added to decode information. Further, implementation of redundancy in by one memories is easier than byte wide or nibble mode memories.

The memory has nine outputs denoted by DQ0-DQ8 and is organized as 256 rows by 144 columns in each half with 16 adjacent column in each half belonging to one bit position. There are four redundant columns, two in each half of the bar. Each of the two columns in a half is capable of replacing any of the 144 columns. Implementation of column redundancy in the present disclosures is modular with a cell called FUSE8 associated with each redundant column. FUSE8 performs the functions of storing information as condition of fuses, detecting a column address match, and enabling the output of the redundant column on the proper bus. Further, it contains circuits to blow the fuses and read them. There are also three cells called RBP, LBP and UCKT associated with the bar. RBP and LBP disable the output of a bad DQ (bit position) on the basis of bit position information and address match information. Bit position information is DC and address match information is generated for both the redundant columns on each side in FUSE8 and bussed on metal.

High voltage required to blow the fuse is introduced through VPH pad and is bussed close to the fuses. Conditioning of this pin and a low voltage logic supply pin requires some devices and these are included in a cell called UCKT.

Each redundant column can replace any one of 144 normal columns. These 144 columns are divided as nine groups of sixteen each. Selection of one out of sixteen columns is through column addresses AY3-AY0 (MSB-LSB). In layout the significance is 0-15 left to right in both the halves. The nine groups themselves correspond to nine bit positions and are layed out DQ8-DQ0 in the right hand side and mirror imaged on the left hand side. AY4 determines choice of left side or right with AY4=0 being the left side. Eight fuses (capable of addressing 256 states) are used to include information about the column being replaced and redundancy not being programmed in. Four of the eight fuses store address match information directly. The other four store coded information about DQ as well as states corresponding to no redundancy. These states follow a gray code and are extensions of implementation in 8k×8. (In the following table "BP3" is used to refer to the enable bit, i.e., synonymusly with "e" in the foregoing.) The equivalence is as follows:

RBP, LBP, OOFN CODE
E(nable)=BP3 +BP2. BP1 . BP0

| | CENTER | | | | | | | | |
|---|---|---|---|---|---|---|---|---|---|
| | DQ8 | DQ7 | DQ6 | DQ5 | DQ4 | DQ3 | DQ2 | DQ1 | DQ0 |
| BP3 | 1 | 0 | X | X | X | X | X | X | X |
| BP2 | 1 | 1 | 1 | 1 | 1 | 0 | 0 | 0 | 0 |
| BP1 | 0 | 0 | 0 | 1 | 1 | 1 | 1 | 0 | 0 |
| BP0 | 1 | 1 | 0 | 0 | 1 | 1 | 0 | 0 | 1 |

The physical positioning of the fuses in FUSE8 in also associated with writing and reading of the fuses where three of the column addresses are used. The positioning and the corresponding column addresses are as follows:

|     | BP3 | BP2 | BP1 | BP0 | AY3M | AY2M | AY1M | AY0M |
|-----|-----|-----|-----|-----|------|------|------|------|
| AY1 | 0   | 0   | 0   | 0   | 1    | 1    | 1    | 1    |
| AY2 | 0   | 0   | 1   | 1   | 0    | 0    | 1    | 1    |
| AY3 | 0   | 1   | 0   | 1   | 0    | 1    | 0    | 1    |

Reading of one of the eight fuses in each of the FUSE8 blocks is accomplished in a special IO cycle with addresses AX1, AX4 held high and AX7 held low. Information appears on DQ1-DQ4 according to the table below.

| REDUNDANCY READ | | | | db O db | | | |
|---|---|---|---|---|---|---|---|
| AY4 | x | DQ1 | d | O | DQ2 | b | O |
| AY0 | x | DQ3 | O | d | DQ4 | O | b |

Each of the fuses is associated with circuitry to enable blowing it as well as transforming the fuse information to a logic level. The fuse structure contains polysilicon over n+ region and the potential of the poly controls the breakdown of the n+ to substrate junction. Heat generated due to breakdown eventually forms a connection between n+ and the poly. Several poly regions are formed over the n+ region resulting in several fuses and the selection of the fuse to be blown is accomplished by controlling the potential of the poly. Fuse writing also can be accomplished in IO cycle in write mode through AY1-AY3 by pulling DQ0-DQ4 low for a fuse blow and high for a no blow. Fuses are preferably blown before dicing.

Address match information is generated for each column using a NOR circuit with the address or its complement as one of the inputs of the NOR depending on the condition of the corresponding fuse. The address match information recognizes the states that correspond to no redundancy. The address match signal enables the redundant column sense amplifier which is also a part of the sense amplifier, and is a component of the signal that disable the regular output. (This is accomplished in RBP and LBP) The bit lines of the column are extended and the loss in speed due to additional bit line capacitance is overcome by the proximity of the columns to the decoder.

Fuse read and write is accomplished in IO cycle and information from the fuse is transferred to the input of IO buffers using pass transistors. A cell to switch redundant column data with one of the nine buses is also part of FUSE8.

The presently preferred embodiment of the invention has been described above in exhaustive detail. However, the present invention is far broader than this embodiment. The present invention contains teachings of fundamental novelty which are applicable to any memory which is organized as more than one bit wide and which has redundancy. The present invention is not applicable only to 8k×9 memories, nor merely to byte wide (as opposed to nibble-wide, word wide, etc.) memories, nor merely to SRAMs only, for merely to memories which are divided into exactly two sub arrays (as opposed to one, four, or more) nor merely to memories which use electrically-blown fuses (as opposed to selectively spiked junctions, selectively implanted devices, laser, e beam, or ion-induced damage, selective ion implanting, or selective metalization, or nonvolatile semiconductor memories devices, or other known methods) to store the redundancy information.

The present invention is applicable to any integrated circuit memory in which:

1. A plurality of memory cells are provided, organized in rows and columns;
2. The memory is organized to store information in groups of more than one bit (e.g. as complete nibbles, or bytes, or words), and each bit position of a stored byte group (e.g. nibble, or byte, or word) contains more than one column of memory cells. In any memory technology which meets these requirements the present invention teaches that an input column address, which selects one column of memory cells at each bit position, is continually monitored and is compared against nonvolitilely stored data indicating the column position of a defective column in some one of the bit positions. When this address match is detected, the read output of the defective column is disabled, and the read output of a redundant column is substituted. Thus, for each redundant column, nonvolatile encoded information specifies which bit position contains a defective column, and also contains bits specifying which of the columns at that bit position is defective.

It is not even necessary that the sense amplifier at the defective column location be disabled, since, depending on the sense amplifier technology used, it would be possible to select the relative output characteristics of the redundant column sense amplifier and of the main column sense amplifiers so that the redundant column sense amplifier, whenever enabled, was able to over power the sense amplifier of the defective column. (of course, this is *not* preferred.) Alternatively, it would also be possible to configure the data buses so that the redundant column logic selectively interupted the data path for the bit which contained a defective column, and plugged the output of the redundant column sense amplifier into the data bus in place of that defective column.

Peferrably, but not necessarily, a disable block is provided for the sense amplifier of each bit position, which is capable of disabling the sense amplifier for that bit position whenever the address of a defective column at that bit position is externally received. Also preferably, but not necessarily, the defective column and bit position information is encoded in the form of blown fuses. Also preferably, but not necessarily, a separate high voltage buss on chip, with a separate contact pad, is provided for the purpose of supplying a high voltage for blowing these fuses. (Note that this contact pad may not be pinned out in the final package, since the high voltage contact pad could merely be contacted by a separate probe during the multiprobe chip testing operation.)

Preferably, but not necessarily, a redundant write buffer is provided, so that, whenever the externally received address indicates that information is to be written at a defective column position, the bit of data which would have been written into the bit position which contains a defective column is written into the redundant column, whether or not it is also written into the actual defective column. Optionally, the write buffer for the actually defective column can be disabled when an address match is detected, so that the write operation writes information only into the redundant column, and not into the defective column.

Optionally, but not necessarily, the bit position information encoded in the redundancy select block for each redundant column is also provided to a multiplexer, which connects the data lines in the redundant column sense amplifier to data bus lines for the encoded bit position selectively, whenever an address match between the external column address and the encoded defective column address is detected. Alternatively, in place of an active multiplexer, hard-wiring, e.g. by devices enabled or destroyed during laser programmation, could be used to perform this function.

Preferably, but not necessarily, the bit position information encoded in the redundancy select logic for each redundant column is provided as a DC signal to a disable block which controls the sense amplifier operation at each bit position, and the sense amplifier at each bit position is disabled only by the combined occurrence of the low-speed bit position signals thus received and a high-speed disable signal which is provided to all disable blocks at all bit positions by the redundancy select logic whenever an address match is detected between the externally received column address and the stored defective column address information.

Preferably, but not necessarily, at least two redundant columns, each having independent redundancy select logic and independently encoded defective column information and bit position information, are provided for each sub array of the memory.

Preferably, but not necessarily, the columns are addressed by metal lines, and the rows are addressed by polysilicon or silicide lines, so that the column access time in the array is shorter than the row access time.

Thus the present invention advantageously provides the above-named objects of the invention, and other advantages too.

As will be appreciated by those skilled in the art, the present invention can be practiced in a wide variety of modifications and variations. The present invention provides a pioneering innovation in more-than-one-bit-wide integrated circuit memories, and is therefore not limited except as specified in the accompanying claims.

What is claimed is:

1. A memory comprising:
 (a) a plurality of memory cells arranged in rows and columns, said columns of memory cells being organized by bit positions, each bit position including more than one of said columns of memory cells and at least one sense amplifier;
 (b) at least one redundant column of memory cells, and a sense amplifier operatively connected thereto;
 (c) at least two output means, said output means being connected to respective ones of said array sense amplifiers to provide simultaneous data outputs corresponding to memory cells at different ones of said bit positions;
 (d) redundancy select logic means for storing defect position information, including both defective column address information and also bit position defect information indicating which of said bit positions includes said defective column; and
 (e) means for comparing column address signals with said stored defective column address signals to provide a match signal;
 (f) said redundancy select logic means including means responsive to a said match signal to connect said redundant column sense amplifier to said output means corresponding to the one of said bit positions which is encoded by said bit position defect information, whenever said externally received column address matches said stored defective column address;
 (g) each of said array cells, said redundant cells, said sense amplifiers, said output means, said means for comparing and said redundancy select logic being integrated on a single chip.

2. The memory of claim 1, further comprising;
 a disable logic, connected to at least one sense amplifier in each of said bit positions, and also connected to said redundancy select logic;
 wherein, whenever said redundancy select logic detects a match between an externally received column address and said stored defective column address, said disable logic disables at least one sense amplifier at the bit position corresponding to said encoded said bit position information in said redundancy select logic.

3. The memory of claim 2,
 wherein said redundancy select logic further comprises a multiplexer,
 and wherein said multiplexer, whenever said redundancy select logic has detected a address match between an externally received column address and said defective column address, connects the output of said column sense amplifier to one of said output means corresponding to said bit position encoded by said bit position information in said redundancy select logic.

4. The memory of claim 1,
 further comprising:
 input means for receiving simultaneously multiple bits of data corresponding to different ones of said bit positions;
 and wherein said redundancy select logic further comprises a redundant column write buffer connected to said redundant memory cell column,
 wherein, if a write condition has externally been indicated, whenever said redundancy select logic detects an address match, said redundancy select logic operatively connects said redundant write buffer to the one of said input means corresponding to the one of said bit positions which has been selected by said bit position information stored in said redundancy select logic;
 whereby, whenever external signals indicate that data is to be written into a defective column, said data is actually written into said redundant column.

5. The memory of claim 1, comprising a plurality of said redundant columns of memory cells, and also comprising a plurality of encoded bits specifying a defective column position for each of said redundant columns.

6. The memory of claim 1, wherein at least one condition of said defective column position encoded information indicates that the redundant column to which said encoded information corresponds does not correspond to any defective column in the array,
 and wherein said redundancy select logic further comprises enablement logic, said enablement logic being connected to disable the operation of said redundancy select logic if and only if said encoded defective column position information of said redundancy select logic indicates that the column of memory cells to which said encoded defect position information corresponds does not correspond to any defective column in the array.

7. The memory of claim 1, wherein said input means are connected to said plurality of sense amplifiers at respective bit positions by data bus, said data bus containing at least one line corresponding to each said bit position.

8. The memory of claim 1, wherein said address decoder comprises a row address decoder,
wherein said row address decoder is connected to a plurality of word lines,
and wherein each said word line runs across all of said columns of said memory cells in said sub array and also across said redundant column.

9. The memory of claim 8, wherein each said column of memory cells is connected to at least one sense amplifier by corresponding bit lines;
and wherein said bit lines in said memory overlie said wordlines.

10. The memory of claim 2,
wherein said redundancy select logic provides said bit position information to said disable logic as a substantially constant signal,
and wherein redundancy select logic provides a disable signal to multiple bit positions as a fast signal whenever said redundancy select logic detects an address match between an externally received column address and said stored defective column address information,
and wherein said disable logic disables a sense amplifier corresponding to one of said bit positions if and only if said portion of said disable logic corresponding to said bit position receives simultaneously both a fast signal indicating a column address match and a slow signal indicating a bit position match from said redundancy select logic.

11. The memory of claim 10 wherein said disable logic holds a pass transistor open continuously, selectively in accordance with said bit position information received from redundancy select logic, and wherein said disable signal provided from redundancy select logic is provided to said pass transistor.

12. The memory of claim 10, wherein said address match signal is provided to said disable logic through a metal line, and wherein said bit position data is provided to said disable block through moat lines.

13. A memory array comprising input means, output means, and a plurality of subarrays, each memory subarray comprising:
(a) a plurality of memory cells arranged in rows and columns, said columns of memory cells being organized by bit positions, each bit position including more than one of said columns of memory cells;
(b) at least one sense amplifier for each of said bit positions, whereby respectively independent bits of information are selectively provided as output from more than one of said bit positions simultaneously;
(c) at least one redundant column of memory cells, and a sense amplifier connected to each said redundant column of said memory cells;
(d) at least two output means, said output means being connected to respective ones of said array sense amplifiers to provide data outputs corresponding to different ones of said bit positions;
(e) an address decoder, connected to receive externally generated row and column addresses, said address decoder being connected to a plurality of said bit positions sense amplifiers to access a plurality of memory cells, each corresponding to said externally received row and column addresses, at more than one of said bit positions simultaneously;
(f) redundancy select logic means for storing defect position information, said defect position information corresponding to the position of a defective column in said array of memory cells, said defect position information including both a column address corresponding to said defective column and also bits indicating which bit position includes said defective column;
(g) said redundancy select logic means being operatively connected to said address decoder, to monitor said externally received column addresses and to detect and being responsive to a match between one of said externally received column addresses and said stored defective column information;
(h) said redundancy select logic means, responsive to said match, connecting said redundent column sense amplifier to said output means corresponding to the one of said bit positions which is encoded by said bit position defect information;
(i) said array cells, said redundant cells, said sense amplifiers, said output means, and said redundancy select logic being integrated on a single chip.

14. The memory of claim 13, further comprising a disable logic, connected to at least one sense amplifier in each of said bit positions, and also connected to said redundancy select logic;
wherein, whenever said redundancy select logic detects a match between an externally received column address and said stored defective column address information, said disable logic disables at least one sense amplifier at the bit position corresponding to said encoded bit position information in said redundancy select logic.

15. The memory of claim 2, wherein redundancy select logic further comprises a multiplexer,
wherein said multiplexer, whenever said redundancy select has detected an address match between an externally recieived column address and said stored defective column address information, connects the output of said redundant column sense amplifier to one of said output means corresponding to said bit position encoded by said bit position information in said redundancy select logic.

16. The memory of claim 13,
further comprising inputs means for receiving simultaneously multiple bits of data corresponding to different ones of said bit positions;
and wherein said redundancy select logic further comprises a redundant column write buffer connected to said redundant memory cell column,
and wherein, if a write condition has externally been indicated, whenever said redundancy select logic detects an address match, said redundancy select logic operatively connects said redundant write buffer to the one of said input means corresponding to the one of said bit position which has been selected by said bit position information in said redundancy select logic,
whereby, whenever external signals indicate that data is to written into a defective column, said data is actually written into said redundant column.

17. The memory of claim 13, comprising a plurality of said redundant column of memory cells, and also comprising a plurality of encoded bits specifying a defective column position for each of said redundant columns.

18. The memory of claim 13, wherein at least one condition of said defective column position decoded information indicates that the redundant column to which said encoded information corresponds does not correspond to any defective column in the array, and wherein said redundancy select logic further comprises enablement logic, said enablement logic being connected to disable other operations of said redundancy select logic if and only if said encoded defective column position information of redundancy select logic indicates that the column of memory cells to which said encoded defect position information corresponds does not correspond to any defective column in the array.

19. The memory of claim 13, wherein said input means are connected to said plurality of sense amplifiers at respective bit positions by a data buss, said data bus containing at least one line corresponding to each said bit position.

20. The memory of claim 13, wherein said address decoder comprises a row address decoder, wherein said row address decoder is connected to plurality of wordlines, and wherein each said wordline runs across all of said columns of said memory cells in said subarray and also across said redundant column.

21. The memory of claim 20, wherein each said column of memory cells is connected to at least one sense amplifier by corresponding said bit lines;

And wherein said bit lines in said memory overlie said wordlines.

22. The memory of claim 14,

Wherein said redundancy select logic provides said bit position information to said disable logic as a substantially constant signal, and wherein said redundancy select logic provides a disable signal to multiple bit positions as a fast signal whenever said redundancy select logic detects an address match between an externally received column address and said stored defective column address information, and wherein said disable logic disables a sense amplifier corresponding to one of said bit positions if and only if said portion of said disable logic corresponding to said bit position receives simultaneously both a fast signal indicating a column address match and a slow signal indicating a bit position match from said redundancy select logic.

23. The memory of claim 10, wherein said disable logic holds a pass transistor open selectively in accordance with said bit position information received from said redundancy select logic, and wherein said disable signal provided from said redundancy select logic is provided to said pass transistor.

24. The memory of claim 10, wherein said address match signal is provided to said disable logic through a metal line, and wherein said bit position data is provided to said disable block through moat lines.

* * * * *

REEXAMINATION CERTIFICATE (3339th)

United States Patent [19]
Shah et al.

[11] B1 4,601,019
[45] Certificate Issued Sep. 30, 1997

[54] MEMORY WITH REDUNDANCY

[75] Inventors: Ashwin H. Shah; James D. Gallia, both of Dallas; I-Fay Wang, Richardson; Shivaling S. Mahant-Shetti, Dallas, all of Tex.

[73] Assignee: Texas Instruments Incorporated, Dallas, Tex.

Reexamination Request:
No. 90/004,346, Aug. 29, 1996

Reexamination Certificate for:
Patent No.: 4,601,019
Issued: Jul. 15, 1986
Appl. No.: 528,209
Filed: Aug. 31, 1983

[51] Int. Cl.$^6$ .................................................. G11C 13/00
[52] U.S. Cl. ........................ 365/200; 365/210; 365/230; 371/21.1; 371/21.2; 364/DIG. 1

[56] References Cited

U.S. PATENT DOCUMENTS

| | | | |
|---|---|---|---|
| 3,810,301 | 5/1974 | Cook | 29/593 |
| 3,900,837 | 8/1975 | Hunter | 340/173 R |
| 3,986,179 | 10/1976 | Elmer et al. | 340/173 BB |
| 4,044,340 | 8/1977 | Itoh | 340/173 R |
| 4,047,163 | 9/1977 | Choate et al. | 340/173 R |
| 4,050,061 | 9/1977 | Kitagawa | 340/173 R |
| 4,051,354 | 9/1977 | Choate | 235/312 |
| 4,104,733 | 8/1978 | Satoh | 365/189 |
| 4,114,192 | 9/1978 | Suzuki et al. | 365/189 |
| 4,156,938 | 5/1979 | Proebsting et al. | 365/63 |
| 4,228,528 | 10/1980 | Cenker et al. | 365/200 |
| 4,241,425 | 12/1980 | Cenker et al. | 365/222 |
| 4,277,836 | 7/1981 | Kawakami | 364/900 |
| 4,281,398 | 7/1981 | McKenney et al. | 365/200 |
| 4,291,389 | 9/1981 | Toth | 365/15 |
| 4,310,901 | 1/1982 | Harding et al. | 365/200 |
| 4,346,459 | 8/1982 | Sud et al. | 365/200 |
| 4,376,300 | 3/1983 | Tsang | 365/200 |
| 4,380,066 | 4/1983 | Spencer et al. | 371/10 |
| 4,389,715 | 6/1983 | Eaton, Jr. et al. | 365/200 |
| 4,406,013 | 9/1983 | Reese et al. | 377/29 |
| 4,422,161 | 12/1983 | Kressel et al. | 365/200 |
| 4,426,688 | 1/1984 | Moxley | 365/200 |
| 4,449,207 | 5/1984 | Kung et al. | 365/230 |
| 4,459,685 | 7/1984 | Sud et al. | 365/200 |
| 4,464,747 | 8/1984 | Groudan et al. | 371/50 |
| 4,471,472 | 9/1984 | Young | 365/200 |
| 4,485,459 | 11/1984 | Venkateswaran | 365/200 |

(List continued on next page.)

FOREIGN PATENT DOCUMENTS

| | | |
|---|---|---|
| 58-130495 | 8/1983 | Japan . |
| WO83/02847 | 8/1983 | WIPO . |

OTHER PUBLICATIONS

IBM Technical Disclosure Bulletin, L. Chu and W.C. Wong, "*Redundant Bit Line Code Circuit*", vol. 18, No. 6, Nov. 1975, pp.1777–1778.

Electronics, Technical Articles, Kuo, Kitagawa, Ogden and Hewkin, "*16–k RAM built with proven process may offer high start–up reliability*", May 1976, pp. 81–86.

(List continued on next page.)

*Primary Examiner*—Terrell W. Fears

[57] ABSTRACT

A byte-wide memory with column redundancy. The redundant columns can each be substituted for any column in the half-array, without regard to which bit position the defective column relates to. Fuses store the address information of the defective columns, and when a match between the externally received column address and the stored defective-column-address is found, the sense amplifier for the bit position which contains that defective column is disabled, and the output of the redundant column (selected by whichever word line is activated) is multiplexed into the I-O buss. Thus, before the row address signal has even been decoded, the defective column has been disabled and one of the redundant columns has effectively been substituted. This configuration means that it is not necessary to have one redundant column for every bit position, but each redundant column can substitute for a defective column in any bit position, and more than one defective column in a single bit position can each be replaced.

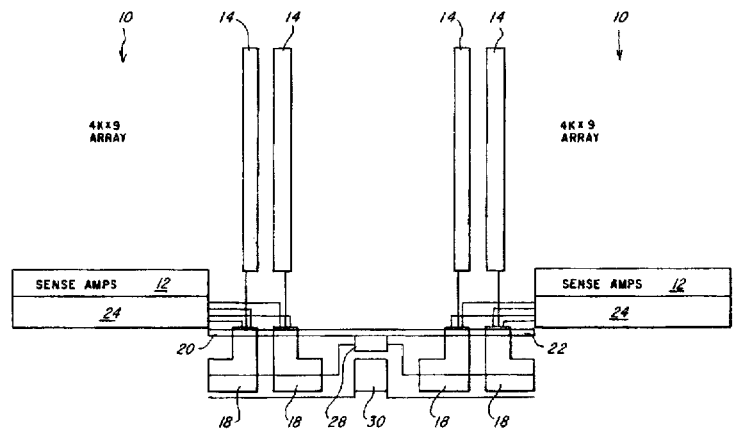

U.S. PATENT DOCUMENTS

| | | | |
|---|---|---|---|
| 4,556,975 | 12/1985 | Smith et al. | 371/10 |
| 4,566,081 | 1/1986 | Ochii | 365/200 |
| 4,566,102 | 1/1986 | Hefner | 371/11 |
| 4,590,588 | 5/1986 | Itoh et al. | 365/51 |
| 4,611,299 | 9/1986 | Hori et al. | 365/189 |

OTHER PUBLICATIONS

McKenney, et al., "*Session XII: ROMs, PROMs and EROMs, THP 12.3: A 5V 64K EPROM utilizing Redundant Circuitry*", IEEE Internationa Solid–State Circuits Conference, Feb. 14, 1980, pp. 146–147 and 270.

Sud, et al., "*16–K static RAM takes new route to high speed*", Electronics Technical articles, Sep. 11, 1980, pp. 117–123.

REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claims 1, 3 and 13 are determined to be patentable as amended.

Claims 2, 4–12 and 14–24, dependent on an amended claim are determined to be patentable.

New claims 25–117 are added and determined to be patentable.

1. A memory comprising:
 (a) a plurality of memory cells arranged in rows and columns, [said] *the* columns of memory cells being organized by bit positions, each bit position including more than one of [said] *the* columns of memory cells and at least one *secondary* sense amplifier, *each bit position further including a plurality of primary sense amplifiers each of which is coupled between one of the columns and the at least one secondary sense amplifier;*
 (b) at least one redundant column of memory cells, and a *redundant* sense amplifier operatively connected thereto;
 (c) at least two output means[, said output means] being connected to respective ones of [said array] *the primary* sense amplifiers to provide simultaneous data outputs corresponding to memory cells at different ones of [said] *the* bit portions, *the simultaneous data outputs being provided to external contact pads;*
 (d) redundancy select logic means for storing defect position information, including both defective column address information and also bit position defect information indicating which of [said] *the* bit positions includes [said] *a* defective column; and
 (e) means for comparing *externally received* column address signals with [said stored] *the* defective column address [signals] *information* to provide a match signal;
 (f) [said] *the* redundancy select logic means including means responsive to [a said] *the* match signal to connect [said] *the* redundant [column] sense amplifier to [said] *the* output means corresponding to the one of [said] *the* bit positions which is encoded by [said] *the* bit position defect information, whenever [said] *the* externally received column address *signals* match[es said] *the* stored defective column address *information*;
 (g) each of [said array] *memory* cells *arranged in rows and columns*, [said] *the* redundant *column of memory* cells, [said] *the* sense amplifiers, [said] *the* output means, [said] *the* means for comparing and [said] *the* redundancy select logic being integrated on a single chip.

3. The memory of claim [2] *1*, wherein [said] *the* redundancy select logic further comprises a multiplexer, and *wherein* [said] *the* multiplexer, whenever [said] *the* redundancy select logic has detected a address match between an externally received column address and [said] *the* defective column address *information*, connects the output of [said column] *the redundant* sense amplifier to one of [said] *the* output means corresponding to [said] *the* bit position encoded by [said] *the* bit position information in [said] *the* redundancy select logic.

13. A memory array comprising input means, output means, and a plurality of subarrays, each memory subarray comprising:
 (a) a plurality of memory cells arranged in rows and columns, [said] *wherein the* columns of memory cells [being] *are* organized by bit positions[.] *and* each bit position [including] *includes* more than one of [said] *the* columns of memory cells;
 (b) at least one *array* sense amplifier for each of [said] *the* bit positions, whereby respectively independent bits of information are selectively provided as outputs from more than one of [said] *the* bit positions simultaneously;
 (c) at least one redundant column of memory cells, and a *redundant* sense amplifier connected to each said redundant column of said memory cells;
 (d) at least two output means[, said output means being] *which are* connected to respective ones of [said] *the* array sense amplifiers to provide *simultaneous* data outputs corresponding to different ones of [said] *the* bit positions;
 (e) an address decoder[,] connected to receive externally generated row and column addresses, [said] *wherein the* address decoder [being] *is* connected to a plurality of [said bit positions] *array* sense amplifiers to access a plurality of memory cells[,] each *of which corresponds* [corresponding] to [said] *the* externally received row and column addresses, *wherein memory cells are accessed* at more than one of [said] *the* bit positions simultaneously;
 (f) redundancy select logic means for storing defect position information, [said] *wherein the* defect position information [corresponding] *corresponds* to the position of a defective column in [said] *the* array of memory cells, [said] *and wherein the* defect position information [including] *includes* both a column address corresponding to [said] *the* defective column and also bits indicating which bit position includes [said] *the* defective column;
 (g) [said] *wherein the* redundancy select logic means [being] *is* operatively connected to [said] *the* address decoder[,] to monitor [said] *the* externally received column addresses and to detect and [being responsive] *respond* to a match between one of [said] *the* externally received column addresses and [said stored defective] *the* column *address corresponding to the defective column* [information];
 (h) [said] *wherein the* redundancy select logic means[, responsive to said match, connecting said] *connects the* redundant [column] sense amplifier to [said] *the* output means corresponding to the [one of said] *bit position[s]* which is encoded by [said] *the bits indicating which* bit position [defect information] *includes the defective column in response to the match signal*;
 (i) [said array] *wherein the memory* cells *arranged in rows and columns*, [said] *the* redundant *column of memory* cells [said] *the* sense amplifiers, [said] *the* output means, and [said] *the* redundancy select logic [being] *are all* integrated on a single chip.

25. The memory of claim 1 wherein each bit position includes at least one sense amplifier for each of the columns of memory cells.

26. The memory of claim 1 wherein the means responsive to the match signal is positioned between the redundant column sense amplifier and the output means.

27. The memory of claim 1 wherein each bit position includes at least one secondary sense amplifier and wherein each bit position further includes a plurality of primary sense amplifiers each being coupled to the at least one secondary sense amplifier.

28. The memory of claim 27 wherein each bit position includes a plurality of secondary sense amplifiers.

29. The memory of claim 28 wherein the each of the secondary sense amplifiers is coupled to a plurality of primary sense amplifiers.

30. The memory of claim 1 wherein the output means is connected to respective ones of the primary sense amplifiers through a secondary sense amplifier.

31. The memory of claim 1 wherein the at least one redundant column of memory cells has a primary sense amplifier and a secondary sense amplifier operatively connected thereto.

32. The memory of claim 1 and further comprising a multiplexer for coupling the redundant sense amplifier to one of the at least two output means in accordane with the bit position defect information encoded in the redundancy select logic.

33. The memory of claim 32 wherein the redundant sense amplifier is positioned between the redundant column of memory cells and the multiplexer.

34. The memory of claim 32 wherein the bit position information is provided to the multiplexer through a plurality of moat lines.

35. The memory of claim 1 wherein the plurality of memor cells comprises a plurality of static random access memory cells.

36. The memory of claim 1 wherein the plurality of memory cells comprises a plurality of dynamic random access memory cells.

37. The memory of claim 1 wherein the plurality of memory cells comprises a plurality of nonvolatile memory cells.

38. The memory of claim 37 wherein the plurality of memory cells comprises a plurality of EPROM cells.

39. The memory of claim 37 wherein the plurality of memory cells comprises a plurality of EEPROM cells.

40. The memory of claim 1 wherein the defective column is disabled prior to enablement of the redundant column by the means responsive to the match signal.

41. The memory of claim 1 wherein the defect position information is stored within a plurality of fuses.

42. The memory of claim 41 wherein each fuse is part of a fuse circuit which includes an amplification and buffering stage.

43. The memory of claim 41 wherein the plurality of fuses comprises a plurality of thin polysilicon fuse links.

44. The memory of claim 41 and further comprising a contact pad for receiving a voltage for blowing selected ones of the plurality of fuses.

45. The memory of claim 44 wherein the memory is disposed in a package including pins and wherein the contact pad is not connected to pins.

46. The memory of claim 1 wherein the defective column address information is stored by a plurality of fuses.

47. The memory of claim 46 wherein the bit position defect information is stored using a plurality of fuses.

48. The memory of claim 47 wherein a different plurality of fuses are used to store the column defect information than are used to store the bit defect information.

49. The memory of claim 48 wherein first, second, third and fourth fuses are used to store the column defect information and fifth, sixth, seventh and eighth fuses are used to store the bit defect information.

50. The memory of claim 1 wherein the memory includes a plurality of subarrays.

51. The memory of claim 1 wherein the memory comprises a four bit wide memory.

52. The memory of claim 1 wherein the memory comprises an eight bit wide memory.

53. The memory of claim 1 wherein the memory comprises a nine bit wide memory.

54. The memory of claim 1 wherein the memory comprises a twenty bit wide memory.

55. The memory of claim 1 wherein the at least one redundant column of memory cells can replace any one of the columns of memory cells organized by bit positions.

56. The memory of claim 1 wherein the at least one redundant column of memory cells comprises a plurality of redundant columns of memory cells, at least one of the redundant columns of memory cells provided for each bit position.

57. The memory of claim 1 wherein the memory includes at least two redundant columns, each having independent redundancy select logic and independenlty encoded defective column address information and bit position defect information.

58. The memory of claim 1 wherein the columns of memory cells are addressed by metal lines.

59. The memory of claim 1 wherein the rows are addressed by polysilicon lines.

60. The memory of claim 1 wherein the rows are addressed by silicide lines.

61. The memory of claim 1 wherein the columns of memory cells are addressed by metal lines and the row are addressed by polysilicon lines.

62. The memory of claim 1 wherein the columns of memory cells are addressed by metal lines and the rows are addressed by silicide lines.

63. The memory of claim 1 wherein a time to access a column is shorter than a time to access a row.

64. A dynamic random access memory comprising:
(a) a plurality of dynamic random access memory cells arranged in rows and columns, the columns of memory cells being organized by bit positions, each bit position including more than one of the columns of memory cells and at least one secondary sense amplifier, each bit position further including a primary sense amplifier for each column of memory cells wherein each primary sense amplifier is coupled between one of the columns and the at least one secondary sense amplifier;
(b) at least one redundant column of memory cells for each bit position, the at least one redundant column of memory cells having a redundant sense amplifier operatively connected thereto;
(c) at least two output means, each being connected to a primary sense amplifier of different ones of the bit positions to provide simultaneous data outputs, the simultaneous data outputs being provided to external contact pads;
(d) redundancy select logic means for storing defect position information, including both defective column address information and also bit position defect information indicating which of the bit positions includes a defective column; and (e) means for comparing an externally received column address with the stored defective column address information to provide a match signal;

(f) the redundancy select logic means including means responsive to the match signal to connect the redundant sense amplifier to the output means corresponding to one of the bit positions which is encoded by the bit position defect information, whenever the externally received column address matches the stored defective column address information;

(g) each of the memory cells, the at least one redundant column of memory cells for each bit position, the sense amplifiers, the output means, the means for comparing and the redundancy select logic being integrated on a single chip.

65. The memory of claim 64 wherein each bit position includes a plurality of secondary sense amplifiers.

66. The memory of claim 65 wherein the each of the secondary sense amplifiers is coupled to a plurality of primary sense amplifiers.

67. The memory of claim 64 wherein the output means is connected to respective ones of the primary sense amplifiers through a secondary sense amplifier.

68. The memory of claim 64 wherein the at least one redundant column of memory cells has a primary sense amplifier and a secondary sense amplifier operatively connected thereto.

69. The memory of claim 64 and further comprising a multiplexer for coupling the redundant column sense amplifier to one of the at least two output means in accordance with the bit position defect information encoded in the redundancy select logic.

70. The memory of claim 64 wherein the bit position defect information is stored by a plurality of fuses.

71. The memory of claim 64 wherein the defective column address information is stored by a plurality of fuses.

72. A dynamic random acess memory comprising:

a plurality of dynamic random access memory cells arranged in rows and columns, the columns of memory cells being organized by bit positions, each bit position including more than one of the columns of memory cells and at least one array sense amplifier for each of the columns of memory cells;

at least one redundant column of dynamic random access memory cells, and a redundant sense amplifier operatively connected thereto;

at least two output means, the output means being connected to respective ones of the array sense amplifiers to provide simultaneous data outputs corresponding to memory cells at different ones of the bit positions, the simultaneous data outputs being provided to external contact pads;

redundancy select logic means for storing defect position information, including both defective column address information and also bit position defect information indicating which of the bit positions includes a defective column; and means for comparing an externally received column address with the defective column address information to provide a match signal;

the redundancy select logic means including means responsive to the match signal to connect the reduntant sense amplifier to the output means corresponding to one of the bit positions which is encoded by the bit position defect information, whenever the externally received column address matches the defective column address information;

wherein each of the dynamic random access memory cells, the at least one redundant column of dynamic random access memory cells, the sense amplifiers, the output means, the means for comparing and the redundancy select logic are integrated on a single chip.

73. The memory of claim 72 and further comprising a multiplexer coupled between the redundant column sense amplifier and the at least two output means, the multiplexer coupling the redundant column sense amplifier to one of the output means in accordance with the bit position defect information encoded in the redundancy select logic.

74. The memory of claim 72 wherein each bit position further includes at least one secondary sense amplifier with an input coupled to an output of the at least one array sense amplifier.

75. The memory of claim 72 wherein each bit position includes at least one array sense amplifier for each of the columns of memory cells.

76. The memory of claim 72 wherein the means responsive to the match signal is positioned between the redundant column sense amplifier and the output means.

77. The memory of claim 72 wherein the array sense amplifier comprises a secondary sense amplifier and wherein each bit position further includes a plurality of primary sense amplifiers each being coupled to the at least one secondary sense amplifier.

78. The memory of claim 77 wherein each bit position includes a plurality of secondary sense amplifiers.

79. The memory of claim 78 wherein the each of the secondary sense amplifiers is coupled to a plurality of primary sense amplifiers.

80. The memory of claim 72 wherein each output means is connected to a primary sense amplifier through a secondary sense amplifier to provide simultaneous data outputs corresponding to memory cells at different ones of the bit positions.

81. The memory of claim 72 wherein the defect position information is stored by a plurality of fuses.

82. The memory of claim 81 wherein the defective column address information is stored by a plurality of fuses.

83. The memory of claim 82 wherein the bit position defect information is stored by a plurality of fuses.

84. The memory of claim 83 wherein a different plurality of fuses are used to store the defective column address information than are used to store the bit position defect information.

85. The memory of claim 84 wherein first, second, third and fourth fuses are used to store the column defect information and fifth, sixth, seventh and eighth fuses are used to store the bit defect information.

86. The memory of claim 81 wherein the plurality of fuses comprises a plurality of thin polysilicon fuse links.

87. The memory of claim 72 wherein the at least one redundant colum of memory cells can replace any one of the columns of memory cells organized by bit positions.

88. The memory of claim 72 wherein the at least one redundant column of memory cells comprises a plurality of redundant columns of memory cells, at least one of the redundant columns of memory cells provided for each bit position.

89. The memory of claim 72 wherein the memory includes at least two redundant columns, each having independent redundancy select logic and independently encoded defective column address information and bit position defect information.

90. A memory comprising:

a plurality of memory cells arranged in rows and columns, the columsn being addressed by metal lines and the rows being addressed by polysilicon or silicide lines, the columns of memory cells being organized by bit positions, each bit position including more than one of the columns of memory cells and at least one sense amplifier;

at least one redundant column of memory cells, and a redundant sense amplifier operatively connected thereto;

at least two output means being connected to respective ones of the array sense amplifiers to provide simultaneous data outputs corresponding to memory cells at different ones of the bit positions;

redundancy select logic means for storing defect position information, including both defective column address information and also bit position defect information indicating which of the bit positions includes the defective column, the bit position defect information being output from the redundancy select logic means through a plurality of moat lines; and means for comparing an externally received column address with the stored defective column address signals to provide a match signal;

the redundancy select logic means including means responsive to the match signal to connect the redundant column sense amplifier to the output means corresponding to the one of the bit positions which is encoded by the bit position defect information, whenever the externally received column address matches the stored defective column address information;

wherein each of the memory cells, at least one redundant column of memory cells, the sense amplifiers, the output means, the means for comparing and the redundancy select logic are integrated on a single chip.

91. The memory of claim 90 wherein the time to access a column is shorter than the time to access a row.

92. The memory of claim 90 wherein the plurality of memory cells comprise a plurality of static random access memory cells.

93. The memory of claim 90 wherein the plurality of memory cells comprise a plurality of dynamic random access memory cells.

94. A dynamic random access memory comprising:

a plurality of dynamic random access memory cells arranged in rows and colums, the columns of memory cells being organized by bit positions, each bit position including more than one of the columns of memory cells and a plurality of secondary sense amplifiers, each bit position further including a primary sense amplifier for each of the columns of memory cells, wherein each of the secondary sense amplifiers is coupled to a plurality of primary sense amplifiers;

at least one redundant column of dynamic random access memory cells, and a redundant sense amplifier operatively connected thereto;

at least two output buffers, the output buffers being connected to respective ones of the array primary sense amplifiers to provide simultaneous data outputs corresponding to memory cells at different ones of the bit positions;

at least two external contact pads, each of the external contact pads for receiving one the simultaneous data outputs;

a plurality of fuses for storing defect position information, including both defective column address information and also bit position defect information, the bit position defect information indicating which of the bit positions includes a defective column;

a decoder for comparing externally received column address signals with the stored defective column address information to provide a match signal; and a pass transistor responsive to the match signal to connect the redundant column sense amplifier to the output buffer corresponding to the one of the bit positions which is encoded by the bit position defect information, whenever the externally received column address signals match the defective column address information, wherein the pass transistor is positioned between the redundant column sense amplifier and the output buffer;

wherein each of the memory cells, the at least one redundant column of dynamic random access memory cells, the sense amplifiers, the output buffers, the decoder for comparing externally received column address signals with the stored defective column address information, the plurality of fuses and the pass transistor are integrated on a single chip.

95. The memory of claim 94 wherein the defective column address information is stored by a plurality of fuese.

96. The memory of claim 95 wherein the bit position defect information is stored by a plurality of fuses.

97. The memory of claim 96 wherein a different plurality of fuses are used to store the defective column address information than are used to store the bit position defect information.

98. The memory of claim 97 wherein first, second, third and fourth fuses are used to store the defective column address information and fifth, sixth, seventh and eighth fuses are used to store the bit position defect information.

99. The memory of claim 94 wherein the at least one redundant column of memory cells can replace any one of the columns of memory cells organized by bit positions.

100. The memory of claim 94 wherein the at least one redundant column of memory cells comprises a plurality of redundant columns of memory cells, at least one of the redundant columns of memory cells provided for each bit position.

101. The memory of claim 94 wherein the memory includes at least two redundant columns, each having independent redundancy select logic and independently encoded defective column address information and bit position defect information.

102. A semiconductor memory device, comprising:

(a) a plurality of memory cells arranged in rows and columns, wherein
  (i) the columns of memory cells are organized by bit positions,
  (ii) each row of memory cells is coupled to a respective row conductor, and
  (iii) each column of memory cells is coupled to a respective column conductor;

(b) a row select circuit for selecting a row of memory cells in response to a row address signal;

(c) a column select circuit for selecting a column of memory cells in response to a column address signal;

(d) a plurality of primary sense amplifiers wherein each primary sense amplifier is coupled to a respective column of memory cells by the respective column conductor;

(e) a plurality of secondary sense amplifiers, wherein
  (i) each secondary sense amplifier corresponds to a respective bit position, and
  (ii) each secondary sense amplifier is coupled to a respective part of the plurality of primary sense amplifiers;
(f) a plurality of output buffers, wherein
  (i) each output buffer is coupled to a respective secondary sense amplifier, and
  (ii) each of the plurality of output circuits is operable to produce simultaneous output data corresponding to a respective bit position;
(g) a plurality of external pads for receiving the simultaneous output data corresponding to the respective bit position;
(h) at least one redundant column of memory cells coupled to a redundant sense amplifier; and
(i) a redundancy select logic circuit for storing defect position information including defective column address information and defective bit position information, wherein
  (i) the defective bit position information indicates which of the bit positions includes a defective column,
  (ii) the redundancy select logic circuit includes a comparison circuit for comparing the column address signal to the defective column address information,
  (iii) the comparison circuit is operable to produce a match signal, and
  (iv) the redundancy select logic circuit is operable to connect the redundant sense amplifier to a respective output circuit indicated by the defective bit position information, responsive to the match signal;
wherein each of the memory cells, the at least one redundant column of memory cells, the sense amplifiers, the output circuits, the comparison circuit and the redundancy select logic are integrated on a single chip.

103. A semiconductor memory device as in claim 102, wherein a column of memory cells corresponding to the defective column address information and defective bit position information is disabled, responsvie to the match signal.

104. A semiconductor memory device as in claim 102, wherein each bit position corresponds to a respective subarray of columns of memory cells.

105. A semiconductor memory device as in claim 104, wherein the at least one redundant column of memory cells comprises a plurality of redundant columns of memory cells, each redundant column of memory cells corresponding to a respective bit position.

106. A semiconductor memory device as in claim 105, wherein the respective column conductor comprises metal.

107. A semiconductor memory device as in claim 106, wherein the respective row conductor comprises polysilicon.

108. A semiconductor memory device as in claim 106, wherein the respective row conductor comprises silicide.

109. A semiconductor memory device as in claim 106, further comprising a first plurality of fuses for storing the defective column address information.

110. A semiconductor memory device as in claim 109, further comprising a second plurality of fuses for storing the defective bit position information.

111. A semiconductor memory device as in claim 110, wherein each of the first and second plurality of fuses comprises polysilicon fuse links.

112. A semiconductor memory device as in claim 109, wherein the memory cells are dynamic random access memory cells.

113. A semiconductor memory device as in claim 109, wherein the memory cells are static random access memory cells.

114. A semiconductor devicce as in claim 109, wherein the memor cells are nonvolatile memory cells.

115. A semiconductor memory device as in claim 112, further comprising at least two redundancy select logic circuits, each redundancy select logic circuit having independent defective column address information and independent defective bit position information, each redundancy select logic circuit independently connecting a respective redundant sense amplifier to a respective output circuit.

116. A semiconductor memory device as in claim 115, further comprising a multiplex circuit for coupling the redundant sense amplifier to the respective output circuit in accordance with the independent defective column address information and the independent defective bit position information.

117. A semiconductor memory device as in claim 116, wherein one of the at least two redundancy select logic circuits independently connects the respective redundant sense amplifier to an output circuit at any one of a plurality of bit positions corresponding to the independent defective bit position information.

* * * * *